United States Patent [19]
Mizutani et al.

[11] Patent Number: 5,946,336
[45] Date of Patent: Aug. 31, 1999

[54] OPTICAL SEMICONDUCTOR APPARATUS, FABRICATION METHOD THEREOF, MODULATION METHOD THEREFOR, LIGHT SOURCE APPARATUS AND OPTICAL COMMUNICATION SYSTEM OR METHOD USING THE SAME

[75] Inventors: Natsuhiko Mizutani, Yokohama; Seiichi Miyazawa, Zama, both of Japan

[73] Assignee: Canon Kabushiki Kaisha, Tokyo, Japan

[21] Appl. No.: 08/774,014

[22] Filed: Dec. 26, 1996

[30] Foreign Application Priority Data

Jan. 11, 1996 [JP] Japan .................................. 8-020528
Jul. 19, 1996 [JP] Japan .................................. 8-209332

[51] Int. Cl.$^6$ ....................................................... H01S 3/18
[52] U.S. Cl. ............................... 372/50; 372/96; 372/45; 372/27
[58] Field of Search .............................. 372/50, 96, 46, 372/45, 27

[56] References Cited

U.S. PATENT DOCUMENTS

| 4,918,701 | 4/1990 | Amann et al. ............................. 372/50 |
| 5,117,469 | 5/1992 | Cheung et al. ............................ 385/11 |
| 5,444,730 | 8/1995 | Mizutani .................................. 372/45 |

FOREIGN PATENT DOCUMENTS

| 0361035 | 4/1990 | European Pat. Off. . |
| 0668641 | 8/1995 | European Pat. Off. . |
| 0674372 | 9/1995 | European Pat. Off. . |
| 2117190 | 5/1990 | Japan . |
| 7162088 | 11/1993 | Japan . |

*Primary Examiner*—Rodney Bovernick
*Assistant Examiner*—Yisun Song
*Attorney, Agent, or Firm*—Fitzpatrick, Cella, Harper & Scinto

[57] ABSTRACT

An optical semiconductor apparatus includes a substrate, a first region formed on the substrate, a second region formed on the substrate, and a stimulating unit. The first region includes a first waveguide which extends in a light propagation direction and is constructed so as to permit light waves in two different polarization modes to be propagated in the propagation direction. The first waveguide contains a first active region which is constructed such that a gain for one of the different polarization modes is dominant. The second region includes a second waveguide which extends in the propagation direction, is coupled to the first waveguide and is constructed so as to permit light waves in the different polarization modes to be propagated in the propagation direction. The second waveguide contains a second active region which is constructed such that a gain for the other of the different polarization modes is dominant. At least one of the first and second active regions includes a first active layer, in which a gain for one of the different polarization modes is dominant, and a second active layer, in which a gain for the other of the different polarization modes is dominant. The stimulating unit stimulates the first and second active regions independently from each other.

35 Claims, 15 Drawing Sheets

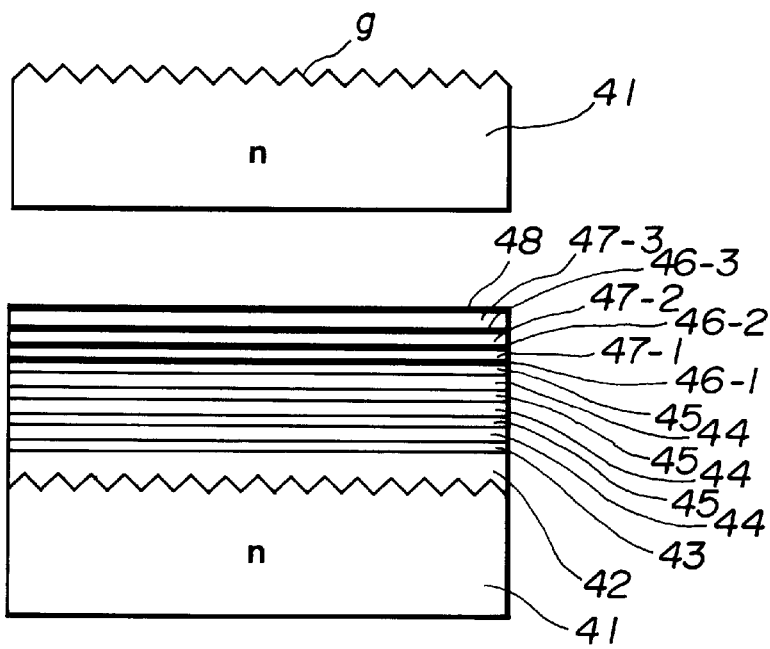
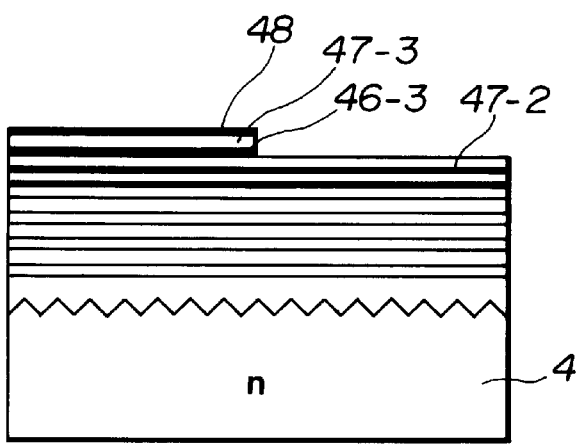
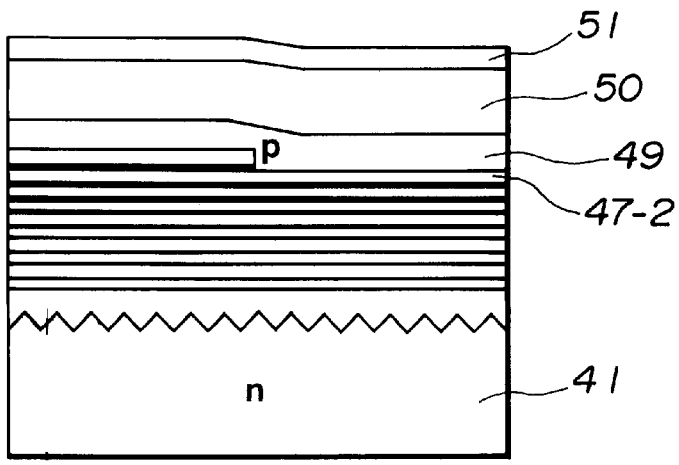

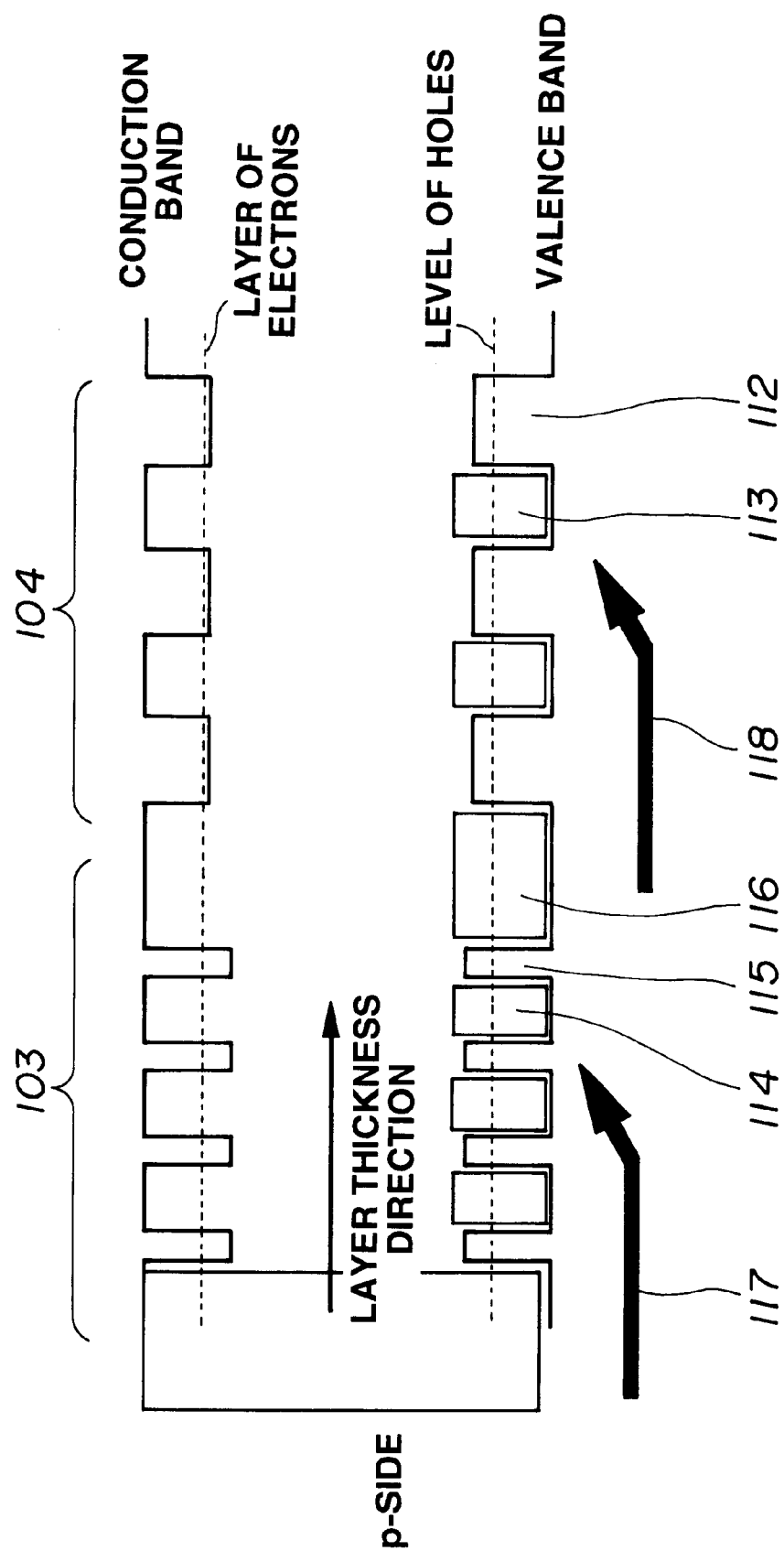

OPTICAL SEMICONDUCTOR APPARATUS, FABRICATION METHOD THEREOF, MODULATION METHOD THEREFOR, LIGHT SOURCE APPARATUS AND OPTICAL COMMUNICATION SYSTEM OR METHOD USING THE SAME

BACKGROUND OF THE INVENTION

1. Field of the Invention

The present invention relates to an optical semiconductor apparatus for use in the fields of optical communication systems and so forth, such as oscillation polarization-mode switchable semiconductor lasers which can be driven by a direct modulation method with reduced dynamic wavelength fluctuation even during high-speed modulation operation, and polarization-mode insensitive optical amplifiers which can substantially equally amplify any polarized light component. The present invention also relates to a fabrication method thereof, a modulation method for modulating or driving the optical semiconductor apparatus, a light source apparatus and an optical communication system or method which use, for example, the optical semiconductor apparatus as a transmitter.

2. Related Background Art

As an oscillation polarization-mode selective or switchable dynamic single mode semiconductor laser, the following device has been developed and proposed (see, for example, Japanese Patent Laid-Open No. 5-310592 (1993)). The oscillation polarization mode of the mode switchable laser device can be modulated by a digital signal which is produced by superposing a minute-amplitude digital signal on a bias injection current. The device is a distributed feedback (DFB) laser in which a distributed reflector, made of a grating, is introduced into a semiconductor laser resonator or cavity, and its property of wavelength selectivity is utilized therein. In the device, strain is introduced into an active layer of a quantum well structure, or the Bragg wavelength is located at a position lower than the peak wavelength of its gain spectrum, so that gains for the transverse electric (TE) mode and the transverse magnetic (TM) mode are approximately equal to each other for light at wavelengths close to an oscillation wavelength, under a current injection condition near its oscillation threshold. Further, a plurality of electrodes are arranged and currents are unevenly injected through those electrodes. An equivalent refractive index of the cavity is unevenly distributed by the uneven current injection, and oscillation occurs in one of the TE mode and the TM mode and at a wavelength which satisfies a phase matching condition and enjoys a minimum threshold gain. When the balance of the uneven current injection is slightly changed to vary the competing relationship of the phase condition between the TE mode and the TM mode, the oscillation polarization mode and the wavelength of the device can be switched.

In that semiconductor device, an antireflection coating is provided on one end facet to asymmetrically employ effects of the uneven current injection between its light-output side and its modulation-current supply side. Alternatively, lengths of the electrodes are made different to introduce effectively structural asymmetry.

Furthermore, Japanese Patent Laid-Open No. 2-117190 discloses a semiconductor laser apparatus in which two semiconductor devices are arranged serially or in parallel. One of them principally oscillates or amplifies a wave in a predetermined polarization mode, and the other one chiefly oscillates or amplifies a wave in another polarization mode. Those devices are provided in a common layer or in parallel layers.

However, the above-discussed conventional oscillation polarization-mode switchable DFB semiconductor laser, which selects the oscillation polarization mode depending on the phase condition, is sensitive to the phase at the end facet. As a result, (1) the oscillation wavelength and polarization mode of the device depend on the current injection condition in a complicated way, and (2) variance in characteristics concerning the oscillation polarization mode and so forth appears among the individual devices. If antireflection coatings were to be provided on both end facets to solve those disadvantages (1) and (2), asymmetry in a light propagation direction of the device would be weakened and the effect of the uneven current injection would be reduced. Thus, stable switching of the oscillation polarization mode would be lost.

In the apparatus of Japanese Patent Laid-Open No. 2-117190, the oscillation or amplification of the wave in a predetermined polarization mode is performed by selecting a device's geometric shape. As a result, its yield is decreased, depending on the variance in etched depth and ridge width that occurs during the ridge fabrication process.

SUMMARY OF THE INVENTION

An object of the present invention is to provide an optical semiconductor apparatus, such as an oscillation polarization-mode selective semiconductor lasers, whose oscillation polarization mode can be stably switched with regions respectively having dominant gains for different polarization modes (typically the TE mode and the TM mode), a fabrication method thereof and so forth.

The object of the present invention is achieved by the following optical semiconductor apparatuses, optical semiconductor fabrication methods, optical communication methods and systems, and a light source apparatus using the optical semiconductor apparatus.

According to one aspect of the present invention for achieving this object, there is provided an optical semiconductor apparatus which includes a substrate, a first region formed on the substrate, a second region formed on the substrate and a stimulating unit, such as a current injection unit. The first region includes a first waveguide which extends in a light propagation direction and is constructed so as to permit light waves in two different polarization modes to be propagated in the light propagation direction. The first waveguide contains a first active region which is constructed such that a gain for one of the two different polarization modes is dominant. The second region includes a second waveguide which extends in the light propagation direction, is coupled to the first waveguide and is constructed so as to permit light waves in the two different polarization modes to be propagated in the light propagation direction. The second waveguide contains a second active region which is constructed such that a gain for the other of the two different polarization modes is dominant. At least one of the first active region and the second active region includes a first active layer, in which a gain for one of the two different polarization modes is dominant, and a second active layer, in which a gain for the other of the two different polarization modes is dominant. The stimulating unit stimulates the first active region and the second active region independently from each other.

In the above structure, the first and second active regions respectively have different stimulation or injection-current dependencies of gain spectra for the different polarization modes, so that a competitive state between round-trip gains for the two polarization modes can be stably attained by the stimulating unit. The round-trip gain is the gain obtained during a round-trip propagation in a cavity of the device.

More specifically, the following structures are possible and can be preferably and advantageously adopted aa follows (e.g., a variety of layer combinations in the first and second active regions which facilitate the fabrication of the device by decreasing the number of process steps):

The first region and the second region are serially arranged on the substrate along the light propagation direction. The optical semiconductor apparatus further includes means, such as a diffraction grating, for selecting a radiation wavelength of the optical semiconductor apparatus. Thereby, oscillation wavelength, filtering wavelength or the like can be selected, so that a dynamic single mode laser, which can be stably oscillated, a polarization-mode insensitive optical amplifier with an excellent wavelength transmission characteristic, and the like can be obtained.

Further, the optical semiconductor apparatus further includes end facets and an antireflection coat provided on at least one of the end facets of the optical semiconductor apparatus.

Both of the first and second active regions respectively include the first and second active layers. Both of the first and second active regions respectively include common active layers whose constructions are identical with each other and which respectively include at least one of the first and second active layers. One of the first and second active regions only includes the common active layer and the other of the first and second active regions includes the common active layer and an additional active layer. In this case, the additional active layer may include one of the first and second active layers.

The first active layer includes a non-strained or compressively-strained quantum well layer and the second active layer comprises a tensile-strained quantum well layer. At least one of the non-strained or compressively-strained quantum well layer and the tensile-strained quantum well layer includes a plurality of kinds of quantum well layers. For example, the tensile-strained quantum well layer includes different kinds of tensile-strained quantum well layers.

The first and second active layers respectively have substantially the same transition energy between a ground level of electrons in a conduction band of the quantum well layer and a ground level of holes in a valence band of the quantum well layer.

One of the first and second active regions includes the first active layer and the second active layer formed on the first active layer, and the other of the first and second active regions only includes the second active layer. The second active layers respectively contained in the first and second active regions are identical with each other in construction. In this case, the first active layer contained only in the one active region is preferably located nearer to a p-side than the second active layer is, so that the structure with desired gain characteristics for the different polarization modes can be built with good yield.

One of the first and second active regions includes the first active layer and the second active layer formed on the first active layer, and the other of the first and second active regions includes the first active layer. The first active layers respectively contained in the first and second active regions are identical with each other in construction. In this case, the second active layer contained only in the one active region is preferably located nearer to a p-side than the first active layer is, for the same reason as described above.

The optical semiconductor apparatus further includes an etching stopper layer for stopping an etching process performed during fabrication of the optical semiconductor apparatus. The etching stopper layer may be formed in one of the first and second active regions, or immediately under the first and second active regions. The etching stopper layer, such as an InP layer, can facilitate a stable fabrication of the first and second active regions. As a result, the yield of the device is improved.

The optical semiconductor apparatus further includes a boundary surface improving layer, such as an InP layer, for improving a boundary condition between the first and second active layers. The boundary surface improving layer enables the laser and the amplifier to reduce its threshold current density and improve the amplification efficiency, respectively.

At least one of the first and second active layers is at least partially doped with an impurity. Thereby, gains for the different polarization modes can be readily balanced. The optical semiconductor apparatus further includes a buffer layer formed between the first and second active layers for separating the first and second active layers from each other.

According to another aspect of the present invention for achieving the above-stated object, there is provided a method for driving an optical semiconductor apparatus of the present invention described above. This driving or modulation method includes a step of establishing a bias state, in which the round-trip gain of one of the two different polarization modes competes with the round-trip gain of the other polarization mode, by controlling the amounts of the currents respectively injected into the first active region and the second active region by the stimulating unit. The method also includes the step of establishing a modulation bias point, in which light in one of the two different polarization modes is oscillated, by slightly increasing the amount of the current injected into one of the first active region and the second active region, and the step of switching the polarization mode of the oscillated light between the two different polarization modes by injecting a signal of a minute modulation current into at least one of the first active region and the second active region.

According to another aspect of the present invention, there is provided a method for fabricating the optical semiconductor apparatus described above. This fabrication method includes a step of forming the first active layer and the second active layer consecutively over the first region and the second region on the substrate, a step of etching at least the second active layer at least partially in one of the first region and the second region on the substrate, and a step of forming remaining layers over the first region and the second region on the substrate. Since the first and second active layers can be grown during a crystalline growth process, structures (e.g., compositions and thicknesses of well layers) of the first and second active regions can be almost the same. A difference between the first and second active regions can be made only by a selective etching in the etching step. Further, the remaining layers can be common to the first and second regions. Thus, influences from fluctuations in various parameters in the fabrication process can be reduced. Furthermore, no re-growth boundary surface is formed in the active regions, so that the polarization-mode switching with good oscillation efficiency, and optical amplification with good amplification efficiency, can be attained.

More specifically, the following steps can be added in this fabrication method. A step of forming an etching stopper layer in the active layer can be added to augment the accuracy and stability of the etching step. Or, a step of forming an etching stopper layer between the first active layer and the second active layer can be added. The etching stopper layer can facilitate and ensure an accurate removing process of a portion of the active layer.

A step of forming a protective layer immediately after the formation of the second active layer can be added.

A step of doping at least part of the first active layer and the second active layer with an impurity can be added.

A step of forming a barrier layer between the first active layer and the second active layer can be added.

A step of forming a diffraction grating on the substrate can be added.

Further, the etching step may be stopped halfway between a barrier layer in a quantum well layer of the active layer.

According to another aspect of the present invention for achieving the object, there is provided a method for fabricating an optical semiconductor apparatus of the present invention described above. This fabrication method includes a step of forming the first active layer over the first region and the second region on the substrate, a step of etching the first active layer at least partially in one of the first region and the second region on the substrate, a step of forming the second active layer over the first region and the second region on the substrate, and a step of forming remaining layers over the first region and the second region on the substrate.

More specifically, the following steps can be added in this fabrication method. A step of forming an etching stopper layer in the first active layer can be added. A step of forming an etching stopper layer immediately before the formation of the first active layer can be added.

A step of doping at least part of the first active layer and the second active layer with an impurity can be added. A step of forming a barrier layer between the first active layer and the second active layer can be added. A step of forming a boundary surface improving layer immediately after the formation of the first active layer can be added.

In those fabrication methods, the number of fabrication steps can be reduced, compared with a case where the first and second regions are separately and independently fabricated.

According to still another aspect of the present invention for achieving the object, there is provided an optical communication method for transmitting a signal from a transmitter to a receiver through an optical transmission line, using an optical semiconductor apparatus of the present invention described above. This communication method includes a step of modulating the polarization mode of light output from the optical semiconductor apparatus between two different polarization modes by controlling current injected into the optical semiconductor apparatus, a step of selecting only the light output in one of the two different polarization modes to create an amplitude-modulated signal, and a step of transmitting the amplitude-modulated signal through the optical transmission line.

According to still another aspect of the present invention for achieving the object, there is provided an optical communication system for transmitting a signal from a transmitter to a receiver through an optical transmission line, using an optical semiconductor apparatus of the present invention described above. This communication system includes the optical semiconductor apparatus provided in the transmitter, and a unit (e.g., a polarizer) for selecting only a light output in one of two different polarization modes so as to create an amplitude-modulated signal. A polarization mode of the light output from the optical semiconductor apparatus is modulated between the two different polarization modes by controlling current injected into the optical semiconductor apparatus. The amplitude-modulated signal is transmitted from the transmitter to the receiver through the optical transmission line.

According to yet another aspect of the present invention for achieving the object, there is provided a light source apparatus which includes an optical semiconductor apparatus of the present invention described above, and a unit for selecting only a light output in one of two different polarization modes. A polarization mode of the light output from the optical semiconductor apparatus is modulated between the two different polarization modes by controlling current injected into the optical semiconductor apparatus.

These advantages and others will be more readily understood in connection with the following detailed description of the preferred embodiments in conjunction with the drawings.

BRIEF DESCRIPTION OF THE DRAWINGS

FIGS. 5A–5D are respectively cross-sectional views illustrating a fabrication method of a third embodiment of an optical semiconductor apparatus according to the present invention.

FIG. 9 is a view illustrating the bandgap structure of layers around an active region of the fifth embodiment.

DESCRIPTION OF THE PREFERRED EMBODIMENTS

First Embodiment

Figure 1:
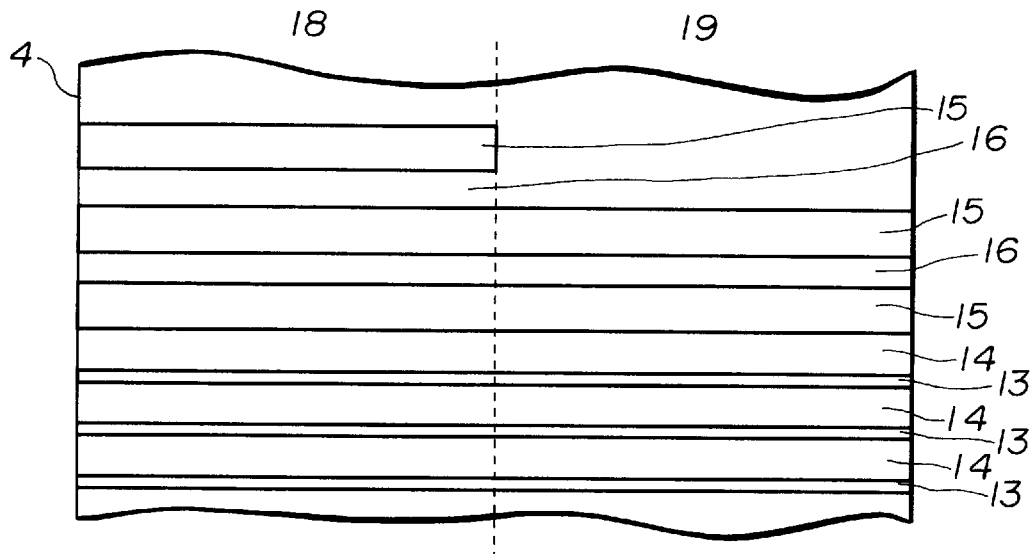
FIG. 1 is a view illustrating the structure of a multiple quantum well active layer of a first embodiment of an optical semiconductor apparatus according to the present invention.
Figure 2:
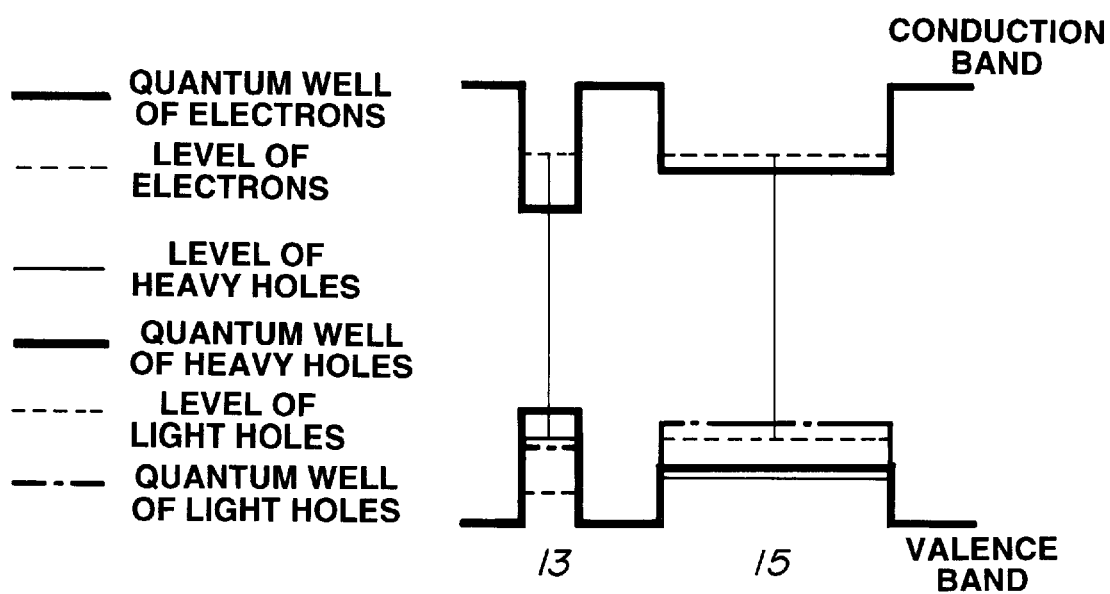
FIG. 2 is a view illustrating bandgap structures of a compressively-strained quantum well and a tensile-strained quantum well contained in an active region of the first embodiment.
Figure 3:
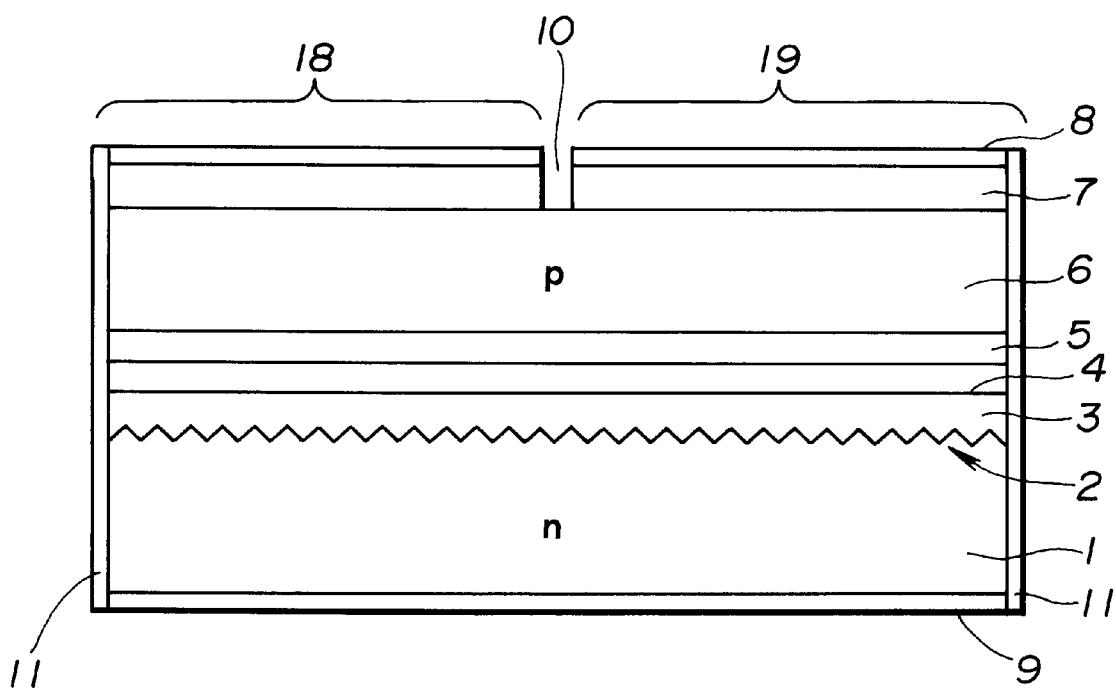
FIG. 3 is a cross-sectional view illustrating the layer structure of the first embodiment.

A first embodiment of the present invention will be described with reference to FIGS. 1–3. In FIG. 1, reference numerals 18 and 19 respectively designate two waveguide portions into which currents can be injected independently of each other. Layer structures of the waveguide portions 18 and 19 are common to each other, except active layers therein. As illustrated in FIG. 3, on an n-type InP substrate 1, a diffraction grating 2 with a depth of 0.05 µm and a pitch of 0.24 µm is formed and the grating 2 is buried with an n-type InGaAsP layer 3 having a thickness of about 0.2 µm and a bandgap wavelength of 1.15 µm to obtain a flat face. Then, an undoped multiple quantum well (MQW) active layer 4 is formed on the InGaAsP layer 3. Details of the active layer 4 are described below.

Further, a p-type InGaAsP upper light guide layer 5 having a thickness of 0.15 µm and a bandgap wavelength of 1.15 µm, a p-type InP clad layer 6 having a thickness of 1.5 µm and a p-type InGaAs contact layer 7 having a thickness of 0.3 µm are consecutively grown on the MQW active layer 4.

To fabricate a structure for laterally confining light and carriers, a ridge is formed and a lateral width of the active layer 4 is etched to 2 µm. The ridge is laterally surrounded by high-resistance InP layers (not shown). Further, a p-side electrode 8 of a Cr/AuZnNi/Au layer and an n-side electrode 9 of an AuGeNi/Au layer are respectively formed on the contact layer 7 and the bottom surface of the substrate 1. Those electode layers 8 and 9 are alloyed. Finally, the p-side electrode 8 and the contact layer 7 are removed at an electrode separation region 10 for dividing the p-side electrode 8 into two electrically-separated portions, and antireflection layers 11 of $SiO_2$ are deposited on opposite end facets of the device.

The structure of the MQW active layer 4 will be described with reference to FIG. 1. The MQW active layer 4 consists of the combination of a compressively-strained quantum well structure and a tensile-strained quantum well structure. The compressively-strained quantum well structure is comprised of InGaAs well layers 13 (thickness; 4 nm, and 0.5% compressive strain) and InGaAsP barrier layers 14 (thickness; 15 nm, and bandgap wavelength; 1.15 µm). The tensile-strained quantum well structure is comprised of InGaAs well layers 15 (thickness; 18 nm, and 0.8% tensile strain) and InGaAsP barrier layers 16 (thickness; 15 nm, and bandgap wavelength; 1.15 µm). FIG. 2 illustrates their bandgap structures. The bandgap wavelength of each quantum well structure is approximately 1.55 µm. The compressively-strained well 13 chiefly imparts a gain to light at a wavelength near the device's Bragg wavelength for the TE mode, which is associated with a transition between a ground level of electrons in the conduction band and a ground level of heavy holes in the valence band, whereas the tensile-strained well 15 imparts a gain to light at wavelengths near the device's Bragg wavelength for the TE mode and the TM mode, which is associated with a transition between the ground level of electrons in the conduction band and a ground level of light holes in the valence band.

In the first waveguide portion 18, there are provided three lower compressively-strained well layers 13 and three upper tensile-strained well layers 15. In contrast, the second waveguide portion 19 contains three lower compressively-strained well layers 13 and two upper tensile-strained well layers 15. In such a layer structure, light in the TM mode would be continuously emitted if a DFB-LD contained only the first waveguide portion 18, while light in the TE mode would be continuously emitted if a DFB-LD contained only the second waveguide portion 19. In the above-discussed device of this embodiment, however, the layer structures of the first and second waveguide portions 18 and 19 are combined with the grating 2 having the above-described pitch. In the assumed DFB-LD having one of the first and second waveguide portions 18 and 19, a relatively large optical gain would also be imparted to light at a wavelength near the Bragg wavelength of the mode that does not yet reach an oscillation state.

In the device of this embodiment wherein the first and second waveguide portions 18 and 19 are connected to each other, the following features appear and its operation is complex. One feature is that the polarization-mode dependency of a gain spectrum in the first waveguide portion 18 differs from the polarization-mode dependency of a gain spectrum in the second waveguide portion 19. Another feature is that the wavelength dependency of round-trip loss or the polarization-mode dependency of round-trip loss is due to characteristics of the DFB laser.

In such a structure of the first embodiment, adjustment of amounts of currents injected into the two waveguide portions can establish a bias state in which the round-trip gains for the TE mode and the TM mode compete with each other. In the competitive state, when the current injected through one of the electrodes is increased, light, for example, in the TM mode oscillates. This state can be set as a modulation bias point. At such a modulation bias point, when a current, which is created by superposing a minute modulation signal on the bias current, is injected through another electrode, the oscillation polarization mode can be switched between the TM mode and the TE mode.

The oscillation polarization-mode switching can also be performed by injecting a bias current plus a minute modulation signal through one of the two electrodes and injecting a bias current plus a minute modulation signal, whose phase is reversed relative to the immediately-above minute modulation signal, through another electrode (so-called a push-pull driving method).

Second Embodiment

A second embodiment of the present invention will be described with reference to FIGS. 4A–4E. This embodiment is directed to a polarization-mode switchable device that has a layer structure which can be readily fabricated.

The fabrication method of the device will be described. Initially, a diffraction grating pattern is formed on an n-type InP substrate 21 by using an interference exposure method, and a substantially periodical striped groove g is formed by an etching process (see FIG. 4A).

Then, the following layers are consecutively grown on the substrate 21. Those layers are an n-type InGaAsP layer 22 having a bandgap wavelength of 1.15 µm for burying the striped groove g therewith, an undoped intrinsic InGaAsP layer 23 having a bandgap wavelength of 1.15 µm, a first quantum well structure comprised of three pairs of InGaAs quantum well layers 24 (thickness; 4 nm, and 0.5% compressive strain) and InGaAsP barrier layers 25 (thickness; 15 nm, and bandgap wavelength; 1.15 µm), a second quantum well structure comprised of two pairs of InGaAs quantum well layers 26 (thickness; 18 nm, and 0.5% tensile strain) and InGaAsP barrier layers 27 (thickness; 15 nm, and bandgap wavelength; 1.15 μm), an intrinsic InP etching stopper layer 28 having a thickness of 10 nm, an InGaAsP barrier layer 29 whose thickness is 15 nm and whose bandgap wavelength is 1.15 μm, an InGaAs quantum well layer 30 whose thickness is 18 nm and into which 0.5% tensile strain is introduced, an InGaAsP barrier layer 31 whose thickness is 15 nm and whose bandgap wavelength is 1.15 μm and an InP protective layer 32 having a thickness of 50 nm (see FIG. 4B).

Figure 4A:
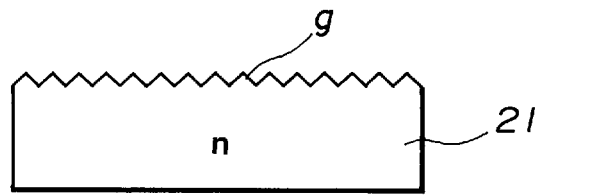
FIGS. 4A–4E are respectively cross-sectional views illustrating a fabrication method of a second embodiment of an optical semiconductor apparatus according to the present invention.
Figure 4B:
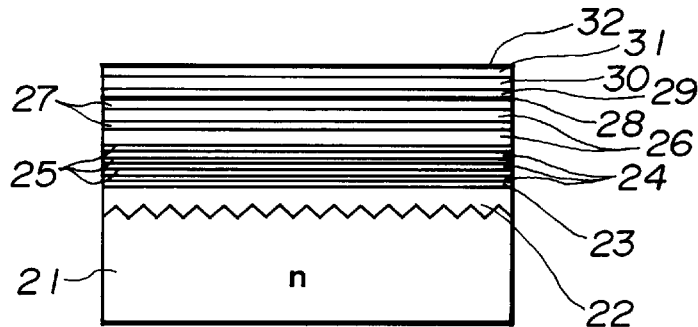
Figure 4C:
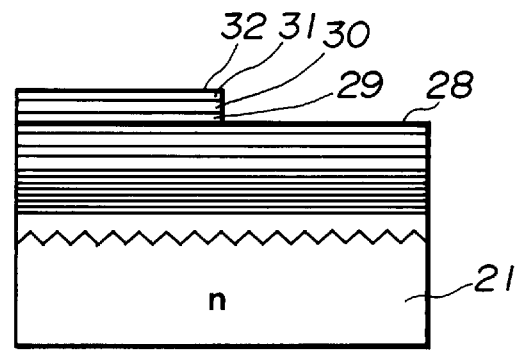

Then, a portion of the thus-fabricated wafer is covered with a resist to be processed by the photolithography, and an opening portion without the resist is removed by a wet etching. That is, the protective InP layer 32 in the opening portion is removed by an etchant of the hydrochloric acid group, and then the InGaAs and InGaAsP layers 31, 30 and 29 are removed by an etchant of the sulfuric acid group. Thereafter, the remaining resist is removed (FIG. 4C).

Figure 4D:
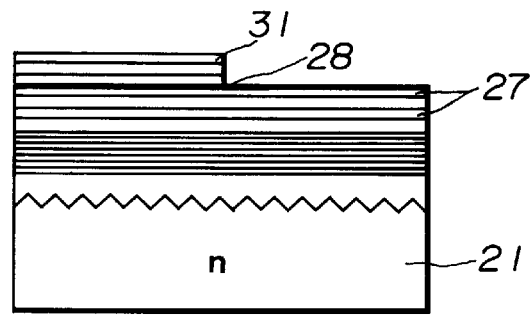

The InP protective layer 32, which is a portion protected by the resist during the etching process with the hydrochloric acid group, and a portion of the etching stopper layer 28 in the etched zone to the right, are removed. Thus, polluted portions and damaged layers are removed to improve a re-growth boundary surface (FIG. 4D).

Then, the wafer is put in a crystalline growth apparatus, and after thermal cleaning, semiconductor layers are newly laid down over the wafer similarly to an ordinary crystalline growth process. Those layers are a p-type InGaAsP light confinement layer 33 having a thickness of 0.1 μm and a bandgap wavelength of 1.15 μm, a p-type InP upper clad layer 34 having a thickness of 1.5 μm and a p-type InGaAs contact layer 35 having a thickness of 0.4 μm.

In this embodiment, during both of the first and second growths discussed above, the CBE method is performed, using materials of arsine ($AsH_3$), phosphine ($PH_3$), trimethyl-indium (TMIn) and triethyl-gallium (TEGa), and solids of Si and Be are used as dopants. Thereafter, by using an ordinary etching process, etching is performed down below the active layer with a stripe of a width of 2 μm being left and both lateral sides of the stripe are buried with Fe-InP semi-insulating layers. Thus, a structure for laterally confining current and light is formed.

Figure 4E:
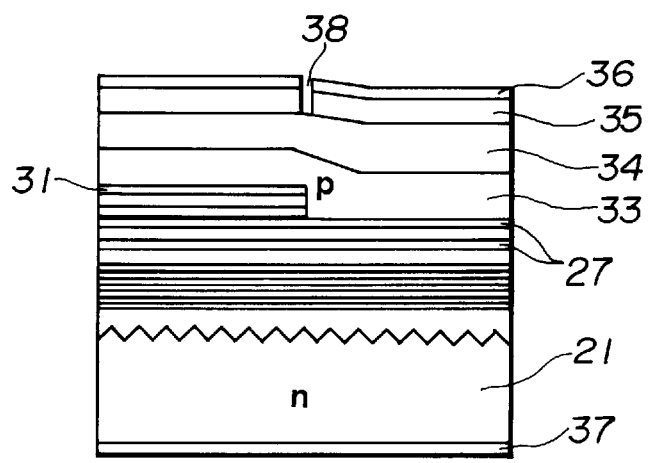

Then, an upper electrode layer 36 is formed, and an electrode separating section 38 is formed by partly removing the electrode layer 36 and the contact layer 35 thereat. Finally, a lower common electrode layer 37 is formed. Thus, a device having two upper electrodes 36 of a length of 250 μm and a cavity length of 500 μm is fabricated (FIG. 4E).

In a first waveguide portion (the left-side region in FIGS. 4A–4B) of this embodiment, there are three lower compressively-strained well layers 24, two upper tensile-strained well layers 26 and one tensile-strained well layer 30. In contrast, a second waveguide portion (the right-side region) has three lower compressively-strained well layers 24 and two upper tensile-strained well layers 26.

The operation and driving of the second embodiment are the same as those of the first embodiment.

Third Embodiment

A third embodiment of the present invention will be described with reference to FIGS. 5A–5D. This embodiment lacks the etching stopper layer for ensuring an accurate etching, distinctively from the second embodiment. Portions, which will not be discussed below, are the same as those in the second embodiment.

The fabrication method of a device of the third embodiment will be described. Initially, a diffraction grating pattern is formed on an n-type InP substrate 41 by using the interference exposure method, and a substantially periodical striped groove g is formed by an etching process (see FIG. 5A).

Then, the following layers are consecutively grown on the substrate 41. Those layers are an n-type InGaAsP layer 42, an undoped intrinsic InGaAsP layer 43, a first quantum well structure comprised of three pairs of InGaAs quantum well layers 44 whose thickness is 18 nm and into which 0.5% tensile strain is introduced and InGaAsP barrier layers 45 whose thickness is 15 nm and whose bandgap wavelength is 1.15 μm, a second quantum well structure comprised of three pairs of InGaAs quantum well layers 46-1, 46-2 and 46-3 whose thickness is 4 nm each and into which 0.5% compressive strain is introduced and InGaAsP barrier layers 47-1, 47-2 and 47-3 whose bandgap wavelength is 1.15 μm, and an InP protective layer 48 having a thickness of 50 nm. With respect to thicknesses of the barrier layers 47-1, 47-2 and 47-3, the central layer 47-2 has a thickness of 25 nm and the thickness of the other layers 47-1 and 47-3 is 15 nm (see FIG. 5B).

Next, a portion of the thus-fabricated wafer is covered with a resist to be processed by the photolithography, and the layers in an opening portion without the resist are removed by a wet etching. That is, the protective InP layer 48 is removed by an etchant of a hydrochloric acid group, and then the InGaAs and InGaAsP layers 47-3, 46-3 and 47-2 are removed by an etchant of a sulfuric acid group. Here, as the etchant, a mixed liquid of $H_2SO_4$, $H_2O_2$ and $H_2O$ (its mixing ratio is $H_2SO_4:H_2O_2:H_2O=3:1:1$ and its temperature is 0° C.) is used, whose etching speed is 0.18 μm/min for the InGaAsP layer. This mixed liquid has an etching rate for the InGaAs layer which is about ten times as fast as that for the InGaAsP layer. Therefore, the etching is advanced through the topmost InGaAs well layer 46-3 to the InGaAsP layer 47-2 during an etching process for eight (8) seconds (FIG. 5C).

Thereafter, the remaining resist is removed. Further, the InP protective layer 48, which is a portion protected by the resist during the etching process with the hydrochloric acid group, is removed. Thus, polluted portions and damaged layers are cleared.

Then, the wafer is put in a crystal growth apparatus, and after the thermal cleaning, semiconductor layers are newly laid all over the wafer similarly to an ordinary crystal growth process. Those layers are a p-type InGaAsP light confinement layer 49 having a thickness of 0.1 μm and a bandgap wavelength of 1.15 μm, a p-type InP upper clad layer 50 having a thickness of 1.5 μm and a p-type InGaAs contact layer 51 having a thickness of 0.4 μm (FIG. 5D). Thus, the layer structure of the laser is completed.

Compared with the device of the second embodiment, the third embodiment features that an InP layer, which will be a damage factor for the current injection into the active layer, does not remain in the active layer. Further, the compressively-strained well layers 46-1, 46-2 and 46-3 each having a small well thickness are located near the top of the device and those layers (46-1, 46-2 and 46-3) are partially removed, so that the difference in the thickness of the quantum well structure between the first and second waveguide portions (left-side and right-side regions respectively) is small, and that the difference in the propagation constant between the first and second waveguide portions is decreased. The operation and driving of the third embodiment are the same as those of the second embodiment.

Fourth Embodiment

Figure 6:
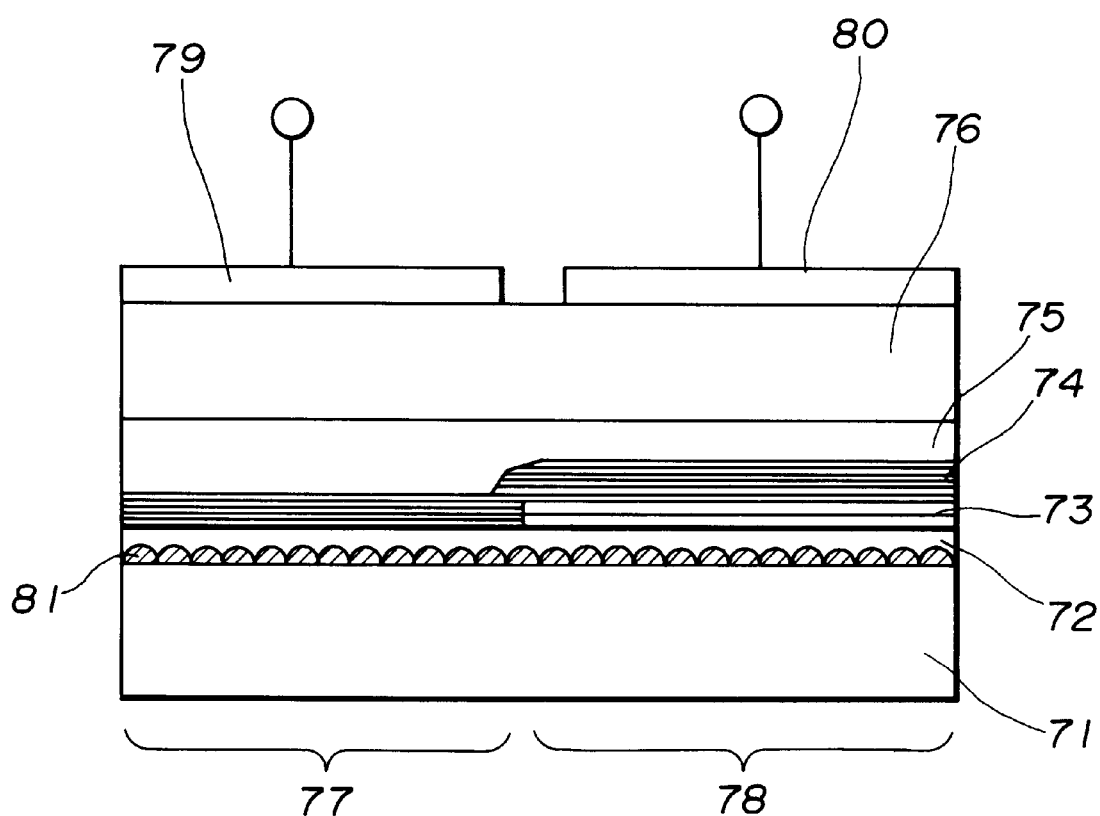
FIG. 6 is a cross-sectional view illustrating the layer structure of a fourth embodiment of an optical semiconductor apparatus according to the present invention.
Figure 7:
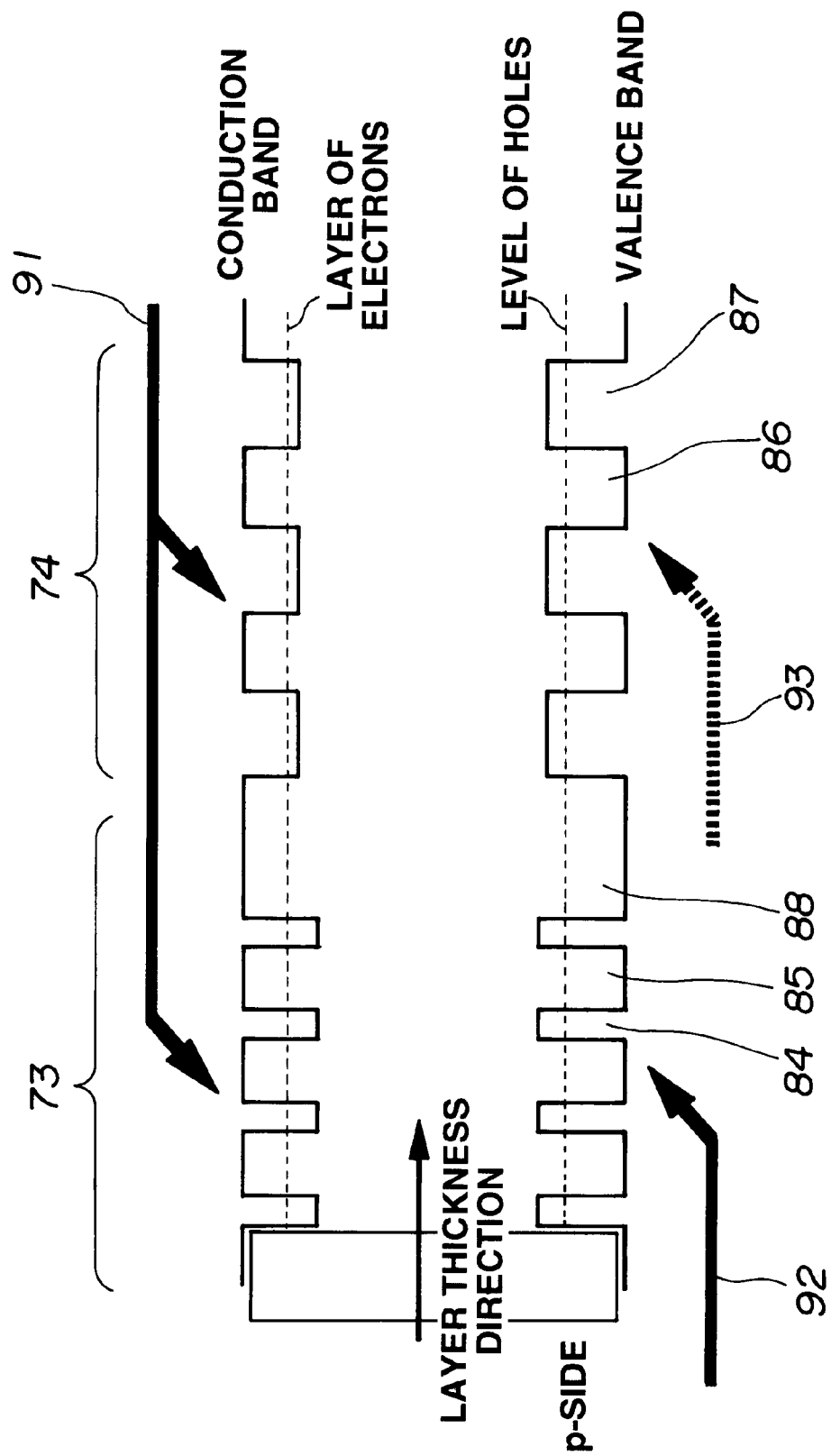
FIG. 7 is a view illustrating the bandgap structure of layers around an active region of the fourth embodiment.

A fourth embodiment of the present invention will be described with reference to FIGS. 6 and 7. This embodiment is also directed to a DFB semiconductor laser. In FIG. 6, which illustrates a cross-section in a light propagation direction, reference numeral 71 designates a p-type InP substrate. The interference exposure process is executed on the substrate 71 to form a diffraction grating 81 having a pitch of 2400 Å. The diffraction grating 81 acts as means for selecting an oscillation wavelength, and hence a laser device of this embodiment can stably radiate a light wave in a single modal manner, similar to the above embodiments.

A semiconductor laser structure is grown on the substrate 71 with the diffraction grating 81. An undoped InGaAsP lower light guide layer 72 having a thickness of 0.15 μm and a bandgap wavelength of 1.15 μm and a first active layer 73 are initially grown on the substrate 71. A compressive strain is introduced into an InGaAs well layer or layers of the first active layer 73 such that a gain for the TE mode is dominant therein. The growth process is stopped after the growth of the first active layer 73, and a part (i.e., the left-side portion) of the first active layer 73 is removed by an ordinary photolithographic process. An etchant is a mixed liquid of $H_2SO_4$, $H_2O_2$ and $H_2O$ (its mixing ratio is $H_2SO_4:H_2O_2:H_2O=1:1:10$), and the etching amount is controlled by etching time. In FIG. 6, the thickness of the first active layer 73 differs along the cavity direction. In the right-side region 78, the first active layer 73 is retained as grown, while in the left-side region 77 the first active layer 73 is entirely removed.

A second growth process is then performed on this wafer. A second active layer 74, in which a tensile strain is introduced into its well layer or layers such that a gain for the TM mode is dominant, is grown on the wafer. Further, an InGaAsP upper light guide layer 75, an Si-doped InP upper clad and an Si-doped InGaAs cap layer (the clad layer and cap layer are collectively denoted by reference numeral 76) are formed on the second active layer 74. The thickness of the upper light guide layer 75 is set to 1000 Å, and its band gap wavelength is set to 1.15 μm. The carrier doping amount of the Si-doped InP clad layer is $1\times10^{18}$ cm$^{-3}$ and its thickness is 1.4 μm. The carrier doping amount of the Si-doped InGaAs cap layer is $3\times10^{18}$ cm$^{-3}$ and its thickness is 0.3 μm. Thus, the re-growth is finished. The thus-grown layer structure is shaped into a ridge-type waveguide laser having a ridge width of 4 μm. Thereafter, n-side upper electrodes 79 and 80 are formed with Au/AuGe, and a p-side common electrode of Au/Cr (not shown) is deposited on the bottom surface of the substrate 71. In order to prevent reflection at cleaved end facets, antireflection coats (not shown) are provided thereon.

The detailed structure of the first and second active layers 73 and 74 in the right-side region 78 and the behavior of carriers thereat will be described with reference to FIG. 7. In FIG. 7, the left side is towards the substrate 71. In the first active layer 73, a 0.5% compressive strain is introduced into four InGaAs well layers 84 such that the gain for the TE mode is dominant, and the structure thereof is constructed such that the oscillation wavelength falls at 1.55 μm. The four well layers 84 and InGaAsP barrier layers 85 (thickness; 100 Å) are alternately laid down to form the first active layer 73. The total thickness of the first active layer 73 is approximately 700 Å.

On the other hand, the second active layer 74 is comprised of 1.0% tensile-strained InGaAs well layers 87 (thickness; 100 Å) and InGaAsP barrier layers 86 (thickness; 100 Å) such that the oscillation wavelength falls at 1.55 μm by controlling thicknesses of layers and the like. An InGaAsP layer 88 is interposed between the first active layer 73 and the second active layer 74. In the InGaAsP layer 88, a re-grown boundary surface is formed between the first active layer 73 and the second active layer 74.

The behavior of carriers in the thus-formed device will be described. Since electrons 91 injected from an n-side (i.e., the side of the cap layer) have long diffusion lengths and barriers thereto in the conduction band are low, the electrons 91 are uniformly supplied to the first and second active layers 73 and 74 as illustrated by thick arrows of the electrons 91. In contrast, diffusion lengths of holes 92 and 93 on a p-side (i.e., the substrate side) are short and barriers thereto in the valence band are high, the amount of hole carriers 93 supplied to the second active layer 74 is small. The hole carriers 92 are chiefly supplied to the first active layer 73 near the p-type region, as illustrated by another thick arrow of the holes 92. Therefore, in the second or right-side region 78, in which the second active layer 74 is laid down over the first active layer 73, only the gain in the first active layer 73 is chiefly stimulated and thus the gain for the TE mode is dominant.

In the first or left-side region 77, which only contains the second active layer 74, the gain for the TM mode is stimulated.

The upper electrodes 79 and 80 are separated from each other such that currents can be independently and respectively supplied to the first region 77 mainly having the gain of the TM mode and the second region 78 having gains of the TE mode and the TM mode. When the current injected into the first region 77 through the electrode 79 is increased, the gain of the TM mode prevails, while the gain of the TE mode dominantly arises when the current is injected into the second region 78 through the electrode 80. In the device of this embodiment, the gains for the TE mode and the TM mode in the entire cavity are regulated by controlling the currents injected through the electrodes 79 and 80, and the oscillation polarization mode is stably switched between the TE mode and the TM mode.

The fourth embodiment features a stable oscillation polarization-mode switching between the TE mode and the TM mode and a small number of fabrication processes in comparison with the conventional case in which TE-mode and TM-mode regions are separately and independently arranged along a cavity direction.

In the fourth embodiment, the p-type substrate 71 is used, but an n-type substrate can be used therefor. In this case, the second active layer 74 is closer to the p-type region, so that the gain in the second active layer 74 is strengthened in the second region 78 as well as in the first region 77. Therefore, gain-dominance conditions in the first and second active layers 73 and 74 need to be adjusted such that gains for different polarization modes are respectively dominant in the first and second regions 77 and 78.

Further, although the active layer having the TE-mode gain is formed as the first active layer 73 which is close to the p-side and the active layer having the TM-mode gain is formed as the second active layer 74 which is away from the p-side, this arrangement can be reversed. That is, even when a layer having a dominant gain of the TM mode is disposed as the first active layer 73 and a layer having a dominant gain of the TE mode is arranged as the second active layer 74, a device of the present invention can be constructed.

Further, the first active layer 73 is wholly removed in the first region 77 of the fourth embodiment, but the first active layer 73 need not be removed wholly therein. A portion of the first active layer 73 may be left in the first region 77 to attain a different gain distribution along the cavity direction. In this case, the thickness of the first active layer 73 differs between the first and second regions 77 and 78, while the second active layer 74 has the same thickness in both of the first and second regions 77 and 78.

Fifth Embodiment

A fifth embodiment of the present invention will be described with reference to FIGS. 8 and 9. As described in the fourth embodiment, the gain of an active layer away from the p-side is difficult to obtain, because of a short diffusion length of hole carriers, when the first and second active layers are laid down in an overlapping manner. In the fifth embodiment, p-type carriers are doped only into barrier layers in first and second active layers, so that a flow of carriers into the second active layer, which is away from the p-side, is facilitated and the gain of the second active layer is strengthened.

Figure 8:
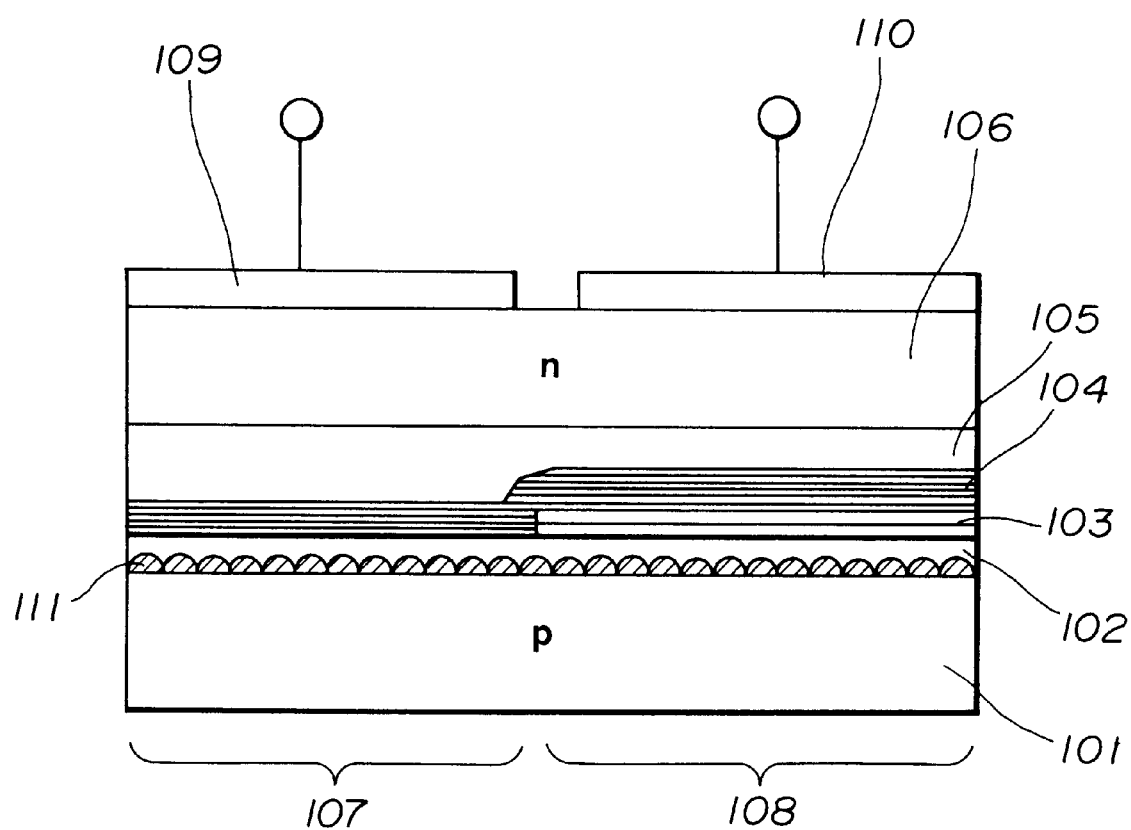
FIG. 8 is a cross-sectional view illustrating the layer structure of a fifth embodiment of an optical semiconductor apparatus according to the present invention.

The structure of a laser of the fifth embodiment is illustrated in FIG. 8. The fifth embodiment is basically the same as the fourth embodiment illustrated in FIG. 6, except for the layer structure around the active layers. In FIG. 8, which is a cross-sectional view in a light propagation direction, reference numeral 101 designates a p-type InP substrate. The interference exposure process is executed on the substrate 101 to shape a diffraction grating 111 having a pitch of 2400 Å.

A semiconductor laser structure is grown on the substrate 101 with the diffraction grating 111. An undoped InGaAsP lower light guide layer 102 having a thickness of 0.10 $\mu$m and a bandgap wavelength of 1.1 $\mu$m and a first active layer 103 are uniformly grown on the substrate 101. This growth process is stopped after the growth of the first active layer 103, and a part of the first active layer 103 is removed by an ordinary photolithographic process. The method of etching used in the embodiment is the same as used in the fourth embodiment. In FIG. 8, the thickness of the first active layer 103 differs along the cavity direction. In a second or right-side region 108, the first active layer 103 remains as grown, while in a first or left-side region 107, the first active layer 103 is entirely removed.

A second growth process is then performed on this wafer. A second active layer 104 is grown on the wafer. Further, an undoped InGaAsP upper light guide layer 105, an Si-doped InP upper clad layer and an Si-doped InGaAs cap layer (the clad layer and cap layer are collectively designated by reference numeral 106) are formed on the second active layer 104. The thickness of the upper light guide layer 105 is set to 1000 Å, and the oscillation wavelength of the structure is set to 1.1 $\mu$m. Thus, the re-growth is finished.

The detailed structure of the first and second active layers 103 and 104 in the second region 108 and the behavior of carriers therein will be described with reference to FIG. 9. In FIG. 9, a left side is towards the substrate 101. In the first active layer 103, four non-strained undoped InGaAs well layers 115 (thickness; 60 Å) and non-strained Be-doped InGaAsP barrier layers 114 (thickness; 100 Å) are alternately laid down to constitute the first active layer 103. The Be-doping amount of the barrier layer 114 is $5 \times 10^{17} \text{cm}^{-3}$.

On the other hand, the second active layer 104 is comprised of three tensile-strained undoped InGaAs well layers 112 (thickness; 100 Å) and non-strained Be-doped InGaAsP barrier layers 113 (thickness; 100 Å) interposed between the well layers 112. A barrier layer 116 is inserted between the first active layer 103 and the second active layer 104. In the barrier layer 116, a re-grown boundary surface is formed between the first active layer 103 and the second active layer 104.

A supply of hole carriers will be described. Both of the first active layer 103 and the second active layer 104 are doped with Be, so that hole carriers exist in the valence band. Therefore, the hole carriers can be relatively uniformly supplied to both of the first active layer 103 and the second active layer 104. Although an optical gain in the first active layer 103 is slightly larger than that in the second active layer 104 since the first active layer 103 is closer to the p-side than the second active layer 104 is, the gains of the first and second active layers 103 and 104 balance with each other. Thus, a state, in which the TE-mode gain and the TM-mode gain compete with each other, can be established.

Finally, after the second region 108 with the two active layers 103 and 104 and the first region 107 with the second active layer 104 are serially formed in the cavity direction, electrodes 110 and 109 are respectively deposited on the two regions 107 and 108. Thus, currents can be injected into those regions 107 and 108 independently from each other.

In FIG. 8, when current is injected through the electrode 110, the TE-mode gain and the TM-mode gain approximately balance each other, with the TE-mode gain being slightly larger. Such a difference in the gain between the TE mode and the TM mode is exceedingly smaller than that in the active layer structure without doping as described in the fourth embodiment. In this state, when current is injected through the electrode 109, the oscillation polarization-mode switching from the TE mode to the TM mode can be performed by just a little change in the amount of carriers.

Here, the difference in the gain between the first active layer 103 and the second active layer 104 can also be controlled by restricting the Be-doped range only within the first active layer 103. This gain difference can also be controlled by controlling the amount of hole carriers, which initially exist, by making the Be-doping concentration in the first active layer 103 different from that in the second active layer 104, for example. Further, the gain can be controlled by controlling the thickness of the barrier layer 116 interposed between the first and second active layers 103 and 104 to regulate the carriers flowing into the second active layer 104 from the p-side.

Sixth Embodiment

A sixth embodiment will now be described with reference to FIGS. 10A through 10D. In the sixth embodiment, the first active layer is not processed, and the gains of the TE mode and the TM mode are controlled by adjusting the thickness of the second active layer which is laid down over the first active layer. This structure is introduced in a distributed feedback reflector laser with a phase control region.

Figure 10A:
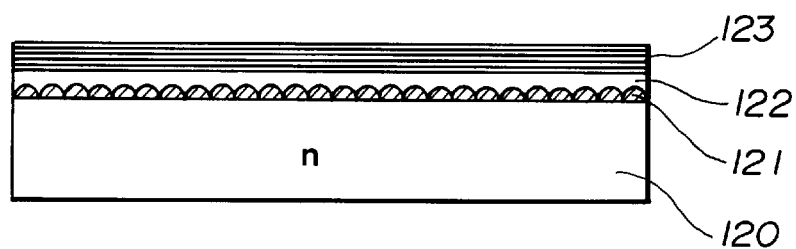
FIGS. 10A–10D are respectively cross-sectional views illustrating a fabrication method of a sixth embodiment of an optical semiconductor apparatus according to the present invention.

The fabrication method of the sixth embodiment is conducted in the following manner. In FIG. 10A, which is a cross-sectional view in a light propagation or cavity direction, reference numeral 120 designates an n-type InP substrate. A two-beam interference exposure process is executed on the substrate 120 to form a diffraction grating 121 having a pitch of 2390 Å.

A semiconductor laser structure is grown on the substrate 120 with the diffraction grating 121. An undoped InGaAsP lower light guide layer 122 having a thickness of 0.2 $\mu$m and a first active layer 123 are uniformly grown on the substrate 120. The first active layer 123 is comprised of three tensile-strained undoped InGaAsP well layers (thickness; 100 Å) and Be-doped InGaAsP barrier layers (thickness; 100 Å) such that the gain of the TM mode is dominant therein.

Figure 10B:
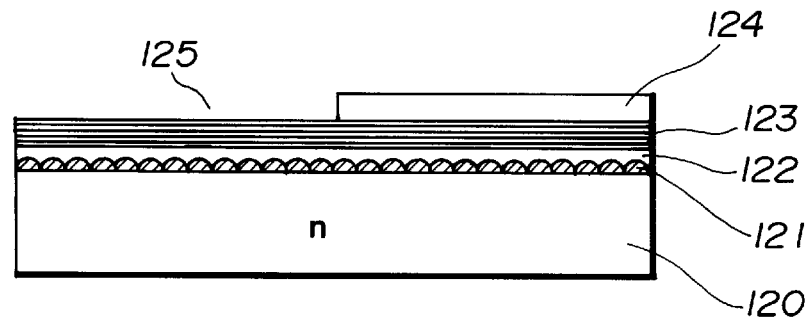

Then, a second active layer 124 is laid down. The second active layer 124 is comprised of five compressively-strained undoped InGaAsP well layers (thickness; 50 Å) and Be-doped InGaAsP barrier layers (thickness; 100 Å) such that the gain of the TE mode is dominant therein. Thereafter, a part of the second active layer 124 is removed. In FIG. 10B, the left-side area where the second active layer 124 is removed is denoted by reference numeral 125.

Figure 10C:
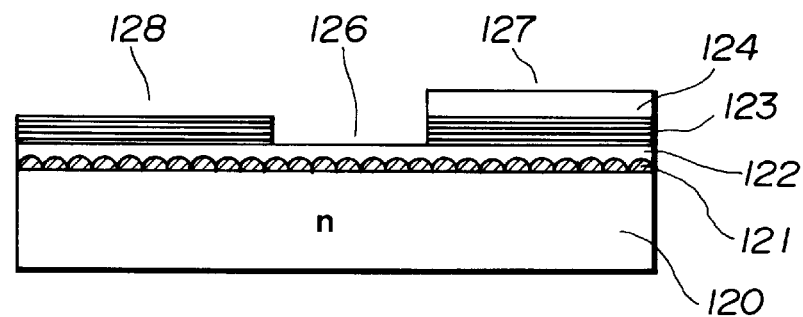
Figure 10D:
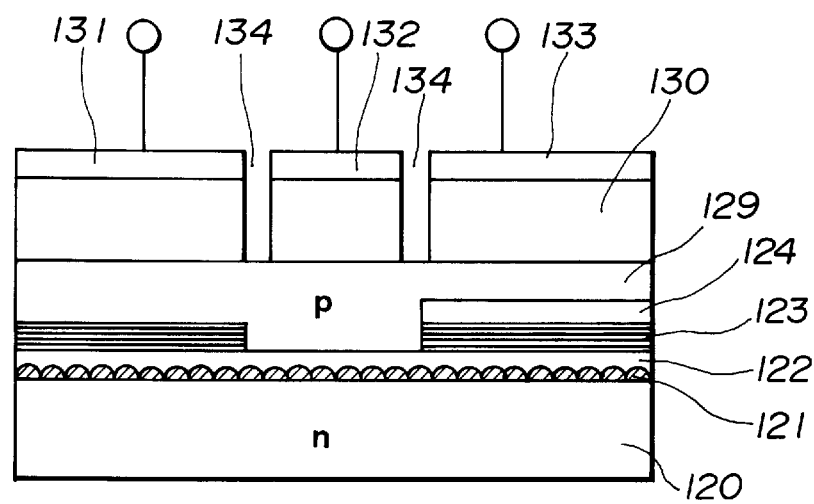

Then, a phase control region where the first and second active layers 123 and 124 are removed is formed as indicated by reference numeral 126 in FIG. 10C. After that, as illustrated in FIG. 10D, a Be-doped InGaAsP upper light guide layer 129 having a thickness of 0.2 µm, a Be-doped InP upper clad layer and a Be-doped InGaAsP cap layer (the clad layer and cap layer are collectively designated by reference numeral 130) are formed on the wafer. The thickness of the Be-doped InP upper clad layer is set to 1.4 µm, and the carrier doping amount of the Be-doped InP upper clad layer is $1 \times 10^{18} \text{cm}^{-3}$. The carrier doping amount of the Be-doped InGaAs cap layer is $1 \times 10^{19} \text{cm}^{-3}$ and its thickness is 0.3 µm. Thus, the re-growth process is finished. Then, as illustrated in FIG. 10D, electrode separation grooves 134 are formed such that the crosstalk between respective electrodes 131, 132 and 133 is reduced.

The operation of the device of this embodiment will be described. Since Be is doped into the barriers in the first active layer 123 and the second active layer 124 in a right-most active region 127, the dominant mode of the gain arising in the first and second active layers 123 and 124 is considered to be selected, depending on thicknesses of the respective active layers 123 and 124 and distances thereof from the p-side.

In the left-most active region 128 of the electrode 131, the gain of the TM mode is dominant since only the first active layer 123 is provided therein. When a current is injected through the electrode 133, the TE-mode gain of the second active layer 124, which is closer to the p-side, becomes dominant since thicknesses of the active layers 123 and 124 are approximately equal to each other. Under a condition under which the TE-mode gain and the TM-mode gain are balanced by currents injected through the electrodes 131 and 133, the oscillation polarization-mode switching can be carried out by slightly changing a current injected into the phase control region 126 through the electrode 132.

The sixth embodiment features no re-grown boundary surface formed between the first active layer 123 and the second active layer 124. This is because the re-growth is performed, after the growth is conducted up to the second active layer 124 and then an etching process is carried out. In the fifth embodiment, the re-growth boundary surface is formed between the two active layers, so that the optical radiation efficiency might be lowered. In this embodiment, it is quite likely to prevent the reduction of the optical radiation efficiency.

Seventh Embodiment

Figure 11A:
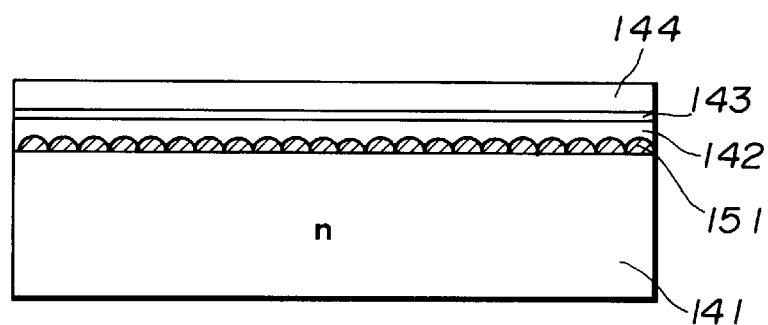
FIGS. 11A–11C are respectively cross-sectional views illustrating a fabrication method of a seventh embodiment of an optical semiconductor apparatus according to the present invention.
Figure 11B:
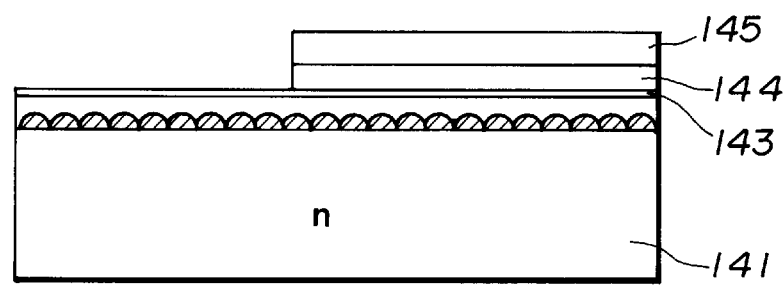

A seventh embodiment of the present invention will be described with reference to FIGS. 11A through 11C. In this embodiment, an InP layer is formed adjacent to an active layer and the InP layer is employed as an etching stopper layer. As a result, a polarization-mode switchable laser can be fabricated with good reproducibility.

The fabrication method of the seventh embodiment will be described. In FIG. 11A, which is a cross-sectional view in a light propagation direction, reference numeral 141 designates an n-type InP substrate. The interference exposure process is executed on the substrate 141 to form a diffraction grating 151 having a pitch of 2380 Å.

A semiconductor laser structure is then grown on the substrate 141 with the diffraction grating 151. An undoped InGaAsP lower light guide layer 142 having a thickness of 2 µm, an InP layer 143 serving as an etching stopper layer and having a thickness of 0.01 µm and a first active layer 144 are grown on the substrate 141. The first active layer 144 is comprised of tensile-strained InGaAsP well layers and InGaAsP barrier layers such that the gain for the TM mode is dominant therein.

The growth process is stopped after the growth of the first active layer 144, and a part (i.e., the left-side portion) of the first active layer 144 is removed by an ordinary photolithographic process. In FIG. 11B, reference numeral 145 is a photoresist. That part of the first active layer 144 is removed with the resist 145 used as a mask. An etchant is a mixed liquid of $H_2SO_4$, $H_2O_2$ and $H_2O$ (its mixing ratio is $H_2SO_4:H_2O_2:H_2O=3:1:1$). Therefore, there is a possibility that the InGaAsP lower light guide layer 142 might be etched by the etchant. To prevent such an unfavorable etching, the InP etching stopper layer 143 is deposited. The InP layer 143 is strongly resistant to a sulfuric acid group etchant, so that the InP layer 143 is hardly etched and a well-controlled etching process is achieved. After the etching, the resist 145 is removed and a re-growth process starts.

A second growth process is performed on the wafer. A second active layer 146, which includes, for example, non-strained undoped InGaAs well layers and non-strained Be-doped InGaAsP barrier layers, is grown on the wafer. Further, as illustrated in FIG. 11C, a Be-doped InGaAsP upper light guide layer 147 having a thickness of 0.1 µm, a Be-doped InP upper clad layer and a Be-doped InGaAs cap layer (the clad layer and cap layer are collectively designated by reference numeral 148) are formed on the second active layer 146. The thickness of the Be-doped InP upper light guide layer 147 is set to 1.4 µm. The carrier doping amount of the Be-doped InP upper light guide layer 147 is $1 \times 10^{18} \text{cm}^{-3}$. The carrier doping amount of the Be-doped InGaAs cap layer is $1 \times 10^{19} \text{cm}^{-3}$ and its thickness is 0.3 µm. Thus, the second growth process is finished. Thereafter, n-side upper electrodes 149 and 150 are formed by dividing an electrode layer into two portions.

The operation of the seventh embodiment is the same as that of the fourth embodiment. In the seventh embodiment, since the etching stopper layer 143 is inserted, the fabrication can be stably performed accurately. The regions respectively having the TE-mode gain and the TM-mode gain can be formed exceedingly stably, and hence its yield is enhanced. Further, the etching stopper layer may be inserted into the active layer such that the thickness of the etched active layer can be effectively adjusted.

Figure 11C:
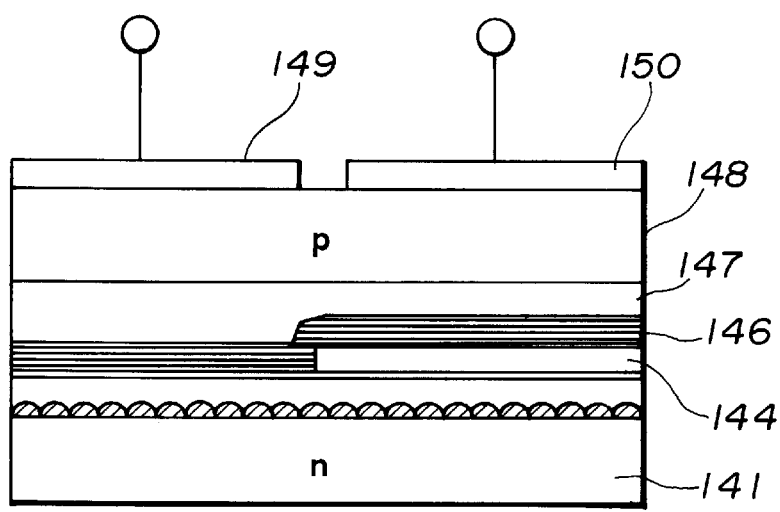

In the seventh embodiment, since the second active layer 146 provided in both of the first and second regions is placed close to the p-type side, the gain in the second active layer 146 is slightly strengthened in the second region (the right-side region in FIG. 11C). Therefore, gain dominance conditions of the first and second active layers 144 and 146 need to be regulated such that the gains for different polarization modes are respectively dominant in the first and second regions.

Eighth Embodiment

Figure 12A:
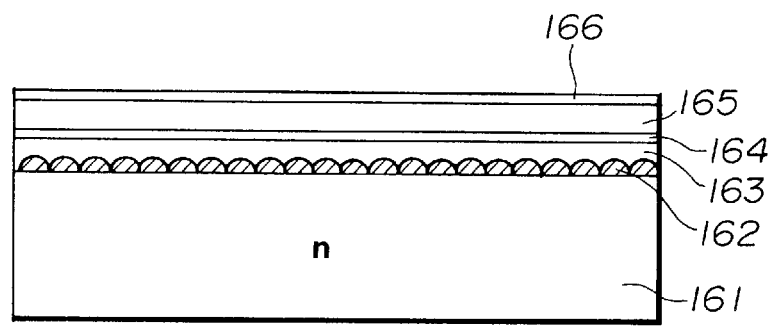
FIGS. 12A–12C are respectively cross-sectional views illustrating a fabrication method of an eighth embodiment of an optical semiconductor apparatus according to the present invention.
Figure 12B:
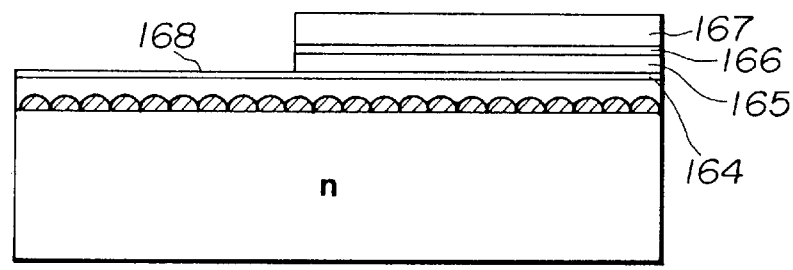

An eighth embodiment of the present invention will be described with reference to FIGS. 12A through 12C. In this embodiment, a thin InP layer is formed on the first active layer to improve a re-growth boundary surface between the first and second active layers.

The structure of the eighth embodiment will be described. In FIG. 12A, which is a cross-sectional view in a light propagation direction, reference numeral 161 designates an n-type InP substrate. The interference exposure process is executed on the substrate 161 to form a diffraction grating 162 having a pitch of 2400 Å.

A semiconductor laser structure is then grown on the substrate 161 with the diffraction grating 162. An undoped InGaAsP lower light guide layer 163 having a thickness of 0.15 $\mu$m, an InP layer 164 serving as an etching stopper layer and having a thickness of 100 Å and a first active layer 165 are grown on the substrate 161. The first active layer 165 is comprised of tensile-strained InGaAsP well layers and InGaAsP barrier layers such that the gain for the TM mode is dominant therein. Reference numeral 166 is an InP layer (thickness; 80 Å) for improving the boundary surface condition for a re-growth process Then, the wafer is processed. Parts (the left-side portions in FIG. 12B) of the InP layer 166 and the first active layer 165 are removed. In FIG. 12B, reference numeral 167 is a photoresist. A part of the InP layer 166 is etched with the resist 167 used as a mask, using an etchant of HCl and $H_2O$ (its mixing ratio is HCl:$H_2O$=1:10). The etching time is 10 seconds. There is no problem, even though the etching may last for a longer time, because the underlaid first active layer 165 is barely corroded by the chloric acid group. Thereafter, part of the first active layer 165 is removed. An etchant is a mixed liquid of $H_2SO_4$, $H_2O_2$ and $H_2O$ (its mixing ratio is $H_2SO_4$:$H_2O_2$:$H_2O$=1:1:10). As described in the seventh embodiment, since the InP layer 164 under the first active layer 165 is highly corrosion-resistant to an etchant of sulfuric acid group, the etching is sure to be stopped at the bottom surface of the first active layer 165. By that processing, a first, or left-side, region without the first active layer 165 is formed, as illustrated by reference number 168.

After the etching is completed, the resist 167 is removed to expose the InP layers 164 and 166 all over the first and second regions and a re-growth process is started. In general, when the re-growth is executed on InGaAsP, oxides will be partially left since oxidized states of elements of InGaAsP are different from each other. Or, when the temperature is raised to completely take off the oxides, the escape of As, P and the like from the surface occurs in the re-growth period. As a result, defects are highly likely to be introduced in the semiconductor crystal. Compared therewith, an oxide film uniformly appears on InP even if the InP is oxidized. Further, the escape of elements is suppressed by sufficiently supplying P. Therefore, the structure is constructed such that the InP layers 164 and 166 are exposed on its topmost surface at the time of the re-growth in this embodiment.

Figure 12C:
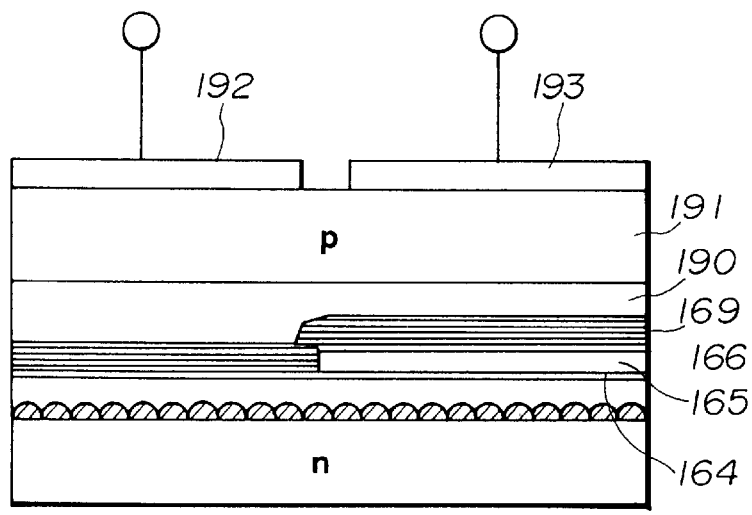

The construction of the re-growth is illustrated in FIG. 12C. A second active layer 169, which includes, for example, non-strained undoped InGaAs well layers and non-strained Be-doped InGaAsP barrier layers, is grown on the wafer. Further, as illustrated in FIG. 12C, a Be-doped InGaAsP upper light guide layer 190 having a thickness of 0.1 $\mu$m, a Be-doped InP upper clad layer and a Be-doped InGaAs cap layer (the clad layer and cap layer are collectively designated by reference numeral 191) are formed on the second active layer 169. The thickness of the Be-doped InP upper light guide layer 190 is set to 1.4 $\mu$m. The carrier doping amount of the Be-doped InP upper clad layer is $1\times10^{18}$cm$^{-3}$. The carrier doping amount of the Be-doped InGaAs cap layer is $1\times10^{19}$cm$^{-3}$ and its thickness is 0.3 $\mu$m. Thus, the re-growth is finished. Thereafter, n-side upper electrodes 192 and 193 are formed by dividing an electrode layer into two portions.

The operation of the eighth embodiment is the same as that of the fourth embodiment. In this embodiment, since the InP layer 166 is inserted, the re-growth boundary surface with a small number of defects can be formed between the first and second active layers 165 and 169. Consequently, a preferable re-growth boundary surface can be attained, and the threshold current density of the semiconductor laser can be largely reduced.

Also in the eighth embodiment, since the second active layer 169 provided in both of the first and second regions is positioned closer to the p-type side, the gain in the second active layer 169 is slightly increased in the second region (a right-side region in FIG. 12C). Therefore, gain dominance conditions of the first and second active layers 165 and 169 need to be regulated such that the gains for different polarization modes are respectively dominant in the first and second regions.

In the above-discussed embodiments, devices can also be used as a polarization-mode insensitive optical amplifier. In such an optical amplifier, a state, in which gains of the TE mode and the TM mode are balanced with each other by injecting appropriate currents below the oscillation threshold through the respective electrodes, is established and incident light is input into the amplifier in this state. The amplifier can substantially evenly amplify light components in all polarization modes.

Ninth Embodiment

Figure 13:
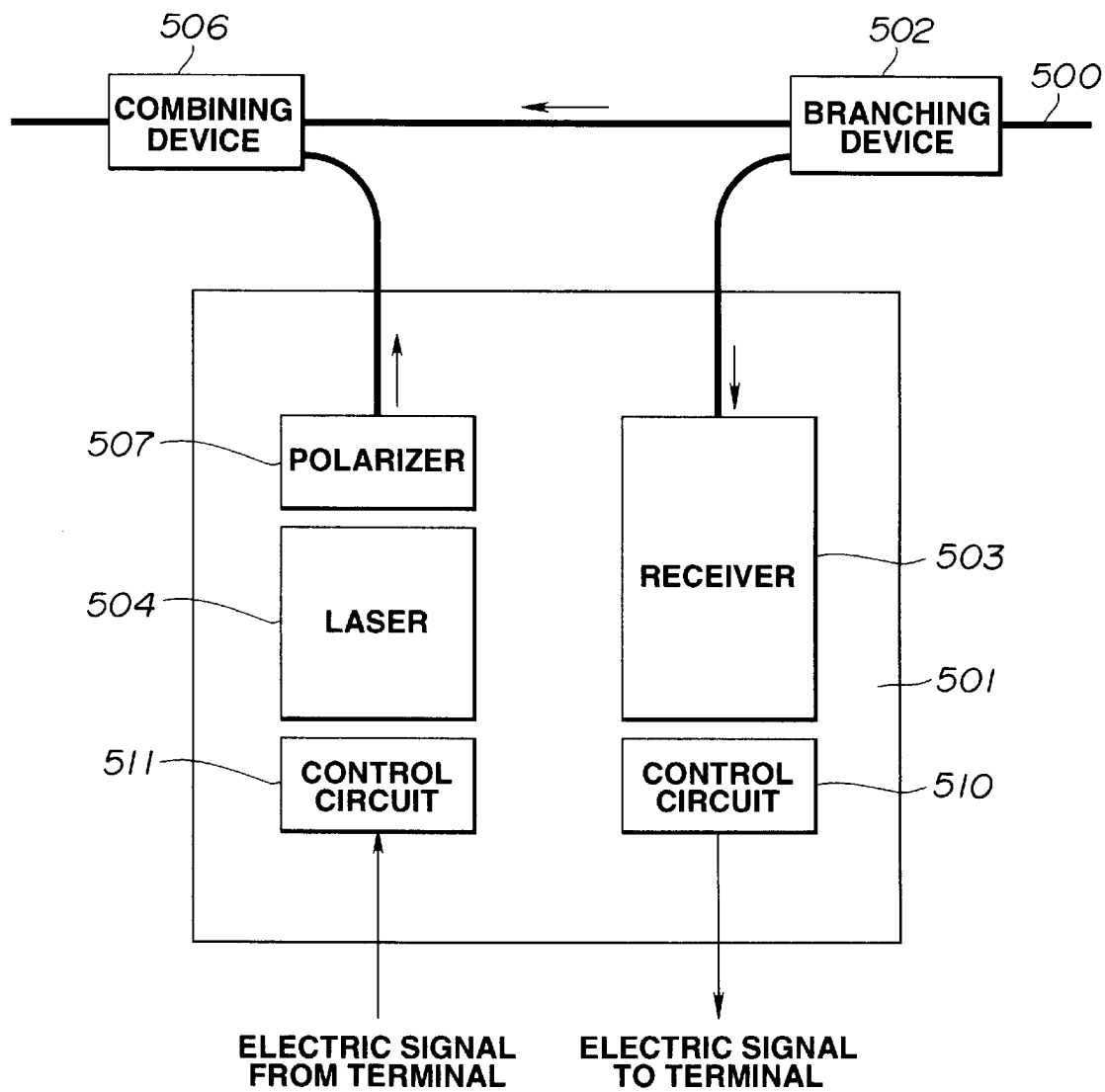
FIG. 13 is a block diagram illustrating a node which contains an optical semiconductor apparatus of the present invention.

A ninth embodiment will now be described with reference to FIGS. 13 and 14. The ninth embodiment is directed to an optical local area network (LAN) system or a wavelength division multiplexing optical LAN system using a light source including an oscillation polarization-mode selective laser apparatus of the present invention. FIG. 13 illustrates an opto-electric converting unit (node), which is connected to a terminal of the optical LAN system shown in FIG. 14.

Figure 14:
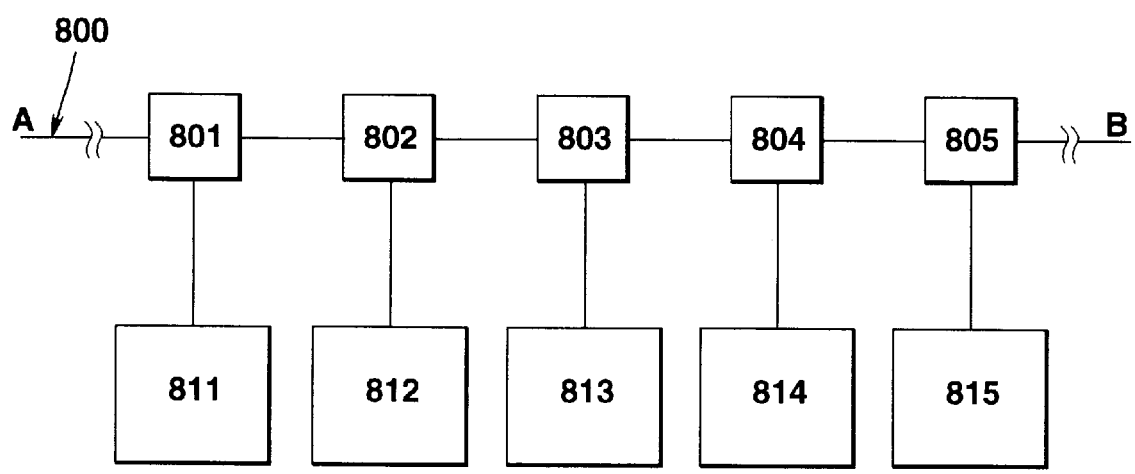
FIG. 14 is a block diagram illustrating a bus-type optical LAN system using nodes as illustrated in FIG. 13.

In the bus-type network shown in FIG. 14, multiple terminals 811, 812, ..., 815 are connected to an optical fiber 800 respectively through optical nodes 801, 802, ..., 805 along a direction A–B.

In FIG. 13, a light signal is taken into the node 501 through the optical fiber 500, and a portion of the signal is input into an optical receiver 503 by a branching device 502. The optical receiver 503 includes a tunable optical filter and a photodetector, and only signal light at a desired wavelength is taken out from the incident signal light, and the signal is detected. The detected signal is properly processed in a control circuit 510 and supplied to the terminal. As an optical filter in the optical receiver 503, a polarization-mode insensitive optical amplifier of the present invention may be used.

On the other hand, when a light signal is transmitted from the node 501, signal light from an oscillation polarization-mode selective semiconductor laser apparatus 504 of the present invention is input into the optical fiber 500 at a combining portion 506 through a polarizer 507 and an isolator (not shown). The laser apparatus 504 is driven by a control circuit 511 according to a method described in the above embodiments, and a polarization-modulated light wave emitted from the laser apparatus 504 is converted to an intensity-modulated light output by the polarizer 507. The isolator may be omitted.

A plurality of tunable optical filters and semiconductor laser apparatuses may be arranged in a node to widen the wavelength tunable range. Further, two nodes may be connected to each terminal and two optical fibers may be provided to accomplish bi-directional transmission of a DQDB system.

In such an optical network system, when the driving method and the optical transmission system of the present invention are used, a high-density wavelength or optical frequency division multiplexing network can be constructed. In the system, the laser apparatus of the present invention can be driven with small chirping even during a high-speed modulation.

Figure 15:
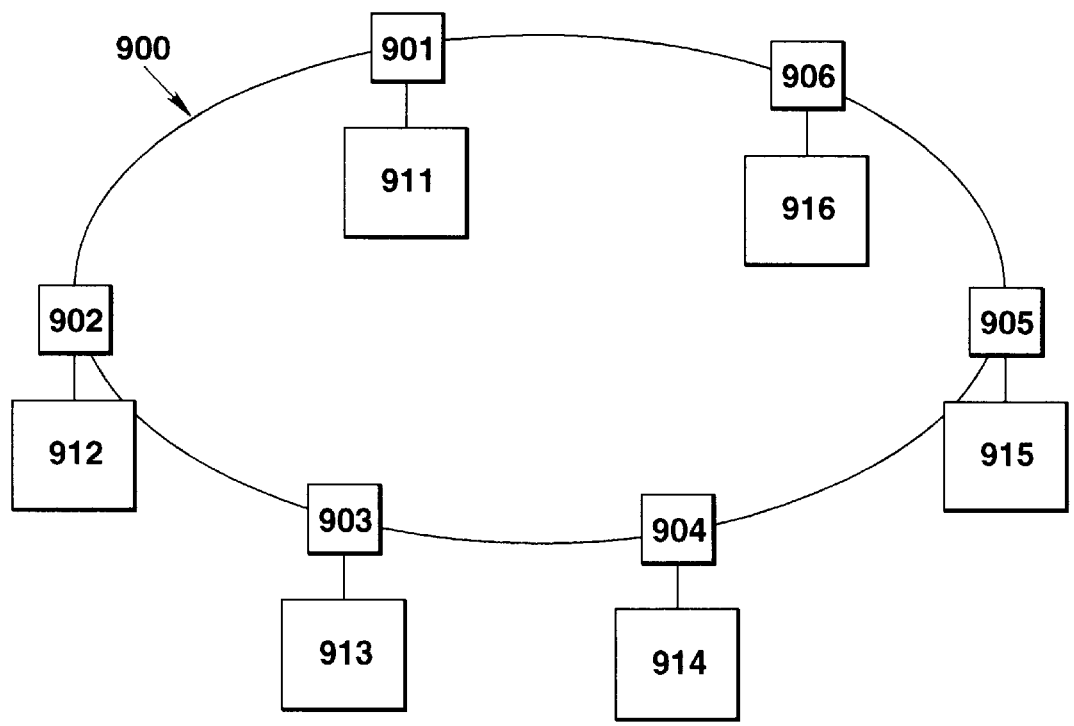
FIG. 15 is a block diagram illustrating a loop type optical LAN system using node as illustrated in FIG. 13.

As a network, a loop type, which is constructed by connecting A and B in FIG. 14, a star type, a loop type or a compound configuration thereof may be used. The loop-type is illustrated in FIG. 15, in which an optical fiber is denoted by reference number 900, optical nodes are denoted by reference numbers 901–906 and their respective terminals are denoted by reference numbers 911–916.

Tenth Embodiment

Figure 16:
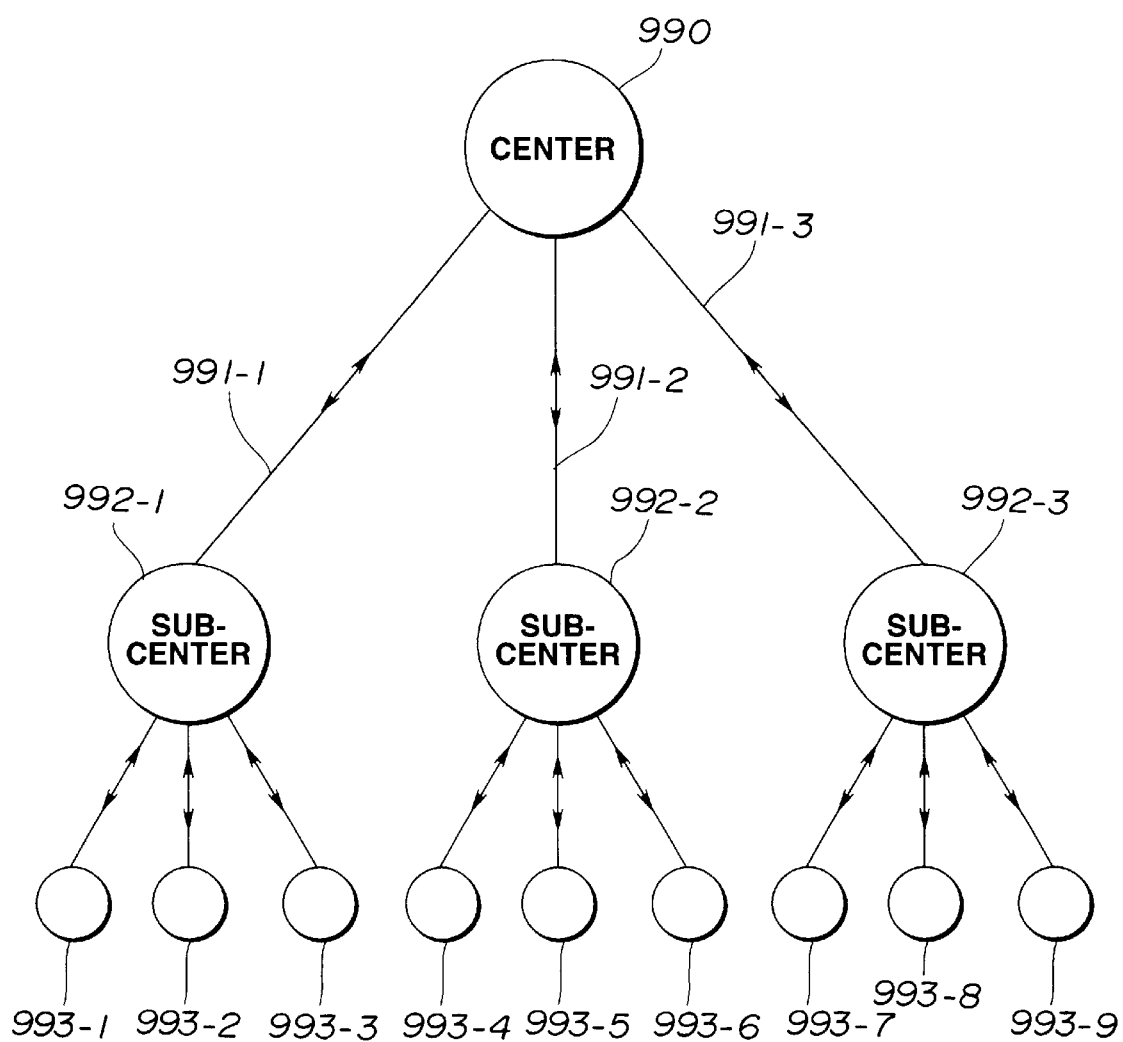
FIG. 16 is a block diagram illustrating an optical CATV system using an optical semiconductor apparatus of the present invention.

A bi-directional optical CATV system, as shown in FIG. 16, can be constructed using an oscillation polarization-mode selective semiconductor laser apparatus of the present invention. In FIG. 16, reference numeral 990 is a CATV center, reference numerals 992-1, 992-2 and 992-3 are sub-centers respectively connected to the center 990 by optical fibers 991-1, 991-2 and 991-3, and reference numerals 993-1, 993-2, . . . 993-9 are receivers of subscribers respectively connected to the sub-centers 992-1, 992-2 and 992-3. In the center 990, a light source apparatus or tunable laser of the present invention is polarization-modulated by a driving method described in the above embodiments, and a plurality of video signals are carried on signal light of 20 different wavelengths to transmit the signals to the receivers 993-1, 993-2, . . . , 993-9. Each receiver includes a tunable wavelength filter and a photodetector, and only signal light at a desired wavelength of input signal light is detected to reproduce a picture image on a monitor. On the subscriber side, the transmission wavelength of the tunable filter is changed to select a desired channel. Thus, a desired picture image can be obtained. Conventionally, it was difficult to use such a DFB filter in that system due to dynamic wavelength fluctuation of a DFB laser. The present invention enables the use of such a DFB filter.

Further, a bi-directional CATV is possible in the following manner. Each of the receivers 993-1, 993-2, . . . , 993-9 has an external modulator (for an example of a simple bi-directional optical CATV, see, for example, Ishikawa and Furuta "LiNbO$_3$ Optical Wavelength Modulator For Bi-directional Transmission in Optical CATV Subscriber Systems", OCS 91-82 1991), and a signal from the subscriber is received as a reflected light (reflected light of a signal light transmitted to the subscriber) from its external modulator. Thus, highly improved services can be obtained.

Except as otherwise disclosed herein, the various components shown in outline or block form in the Figures are individually well known in the optical semiconductor device and optical communication arts, and their internal construction and operation are not critical either to the making or using of this invention or to a description of the best mode of the invention.

While the present invention has been described with respect to what are presently considered to be the preferred embodiments, it is to be understood that the invention is not limited to the disclosed embodiments. The present invention is intended to cover various modifications and equivalent arrangements included within the spirit and scope of the following claims.

What is claimed is:

1. An optical semiconductor apparatus comprising:
   a substrate;
   a first region formed on said substrate, said first region including a first waveguide which extends in a light propagation direction, said first region being constructed so as to permit light waves in two different polarization modes to be propagated in the light propagation direction, said first waveguide containing a first active region which is constructed such that a gain for one of the two different polarization modes is dominant therein;

a second region formed on said substrate, said second region including a second waveguide which extends in the light propagation direction, said second region being coupled to said first waveguide and being constructed so as to permit light waves in the two different polarization modes to be propagated in the light propagation direction, said second waveguide containing a second active region which is constructed such that a gain for the other of the two different polarization modes is dominant therein, at least one of said first active region and said second active region including a first active layer, in which a gain for one of the two different polarization modes is dominant, and a second active layer, in which a gain for the other of the two different polarization modes is dominant; and stimulating means for stimulating said first active region and said second active region independently from each other, wherein both of said first active region and said second active region respectively include common active layers whose constructions are identical with each other and which are respectively comprised of at least one of said first active layer and said second active layer, and wherein one of said first active region and said second active region only includes said common active layer and the other of said first active region and said second active region includes said common active layer and an additional active layer.

2. An optical semiconductor apparatus comprising:
   a substrate;
   a first region formed on said substrate, said first region including a first waveguide which extends in a light propagation direction, said first region being constructed so as to permit light waves in two different polarization modes to be propagated in the light propagation direction, said first waveguide containing a first active region which is constructed such that a gain for one of the two different polarization modes is dominant therein;

a second region formed on said substrate, said second region including a second waveguide which extends in the light propagation direction, said second region being coupled to said first waveguide and being constructed so as to permit light waves in the two different polarization modes to be propagated in the light propagation direction, said second waveguide containing a second active region which is constructed such that a gain for the other of the two different polarization modes is dominant therein, at least one of said first active region and said second active region including a first active layer, in which a gain for one of the two different polarization modes is dominant, and a second active layer, in which a gain for the other of the two different polarization modes is dominant; and stimulating means for stimulating said first active region and said second active region independently from each other, wherein one of said first active region and said second active region includes said first active layer and said second active layer formed on said first active layer and the other of said first active region and said second active region includes only said second active layer.

3. An optical semiconductor apparatus comprising:
   a substrate;
   a first region formed on said substrate, said first region including a first waveguide which extends in a light propagation direction, said first region being constructed so as to permit light waves in two different polarization modes to be propagated in the light propagation direction, said first waveguide containing a first active region which is constructed such that a gain for one of the two different polarization modes is dominant therein;

a second region formed on said substrate, said second region including a second waveguide which extends in the light propagation direction, said second region being coupled to said first waveguide and being constructed so as to permit light waves in the two different polarization modes to be propagated in the light propagation direction, said second waveguide containing a second active region which is constructed such that a gain for the other of the two different polarization modes is dominant therein, at least one of said first active region and said second active region including a first active layer, in which a gain for one of the two different polarization modes is dominant, and a second active layer, in which a gain for the other of the two different polarization modes is dominant; and stimulating means for stimulating said first active region and said second active region independently from each other, wherein one of said first active region and said second active region includes said first active layer and said second active layer formed on said first active layer and the other of said first active region and said second active region includes only said first active layer.

4. An optical semiconductor apparatus according to any one of claims 1, 2 or 3, wherein said first region and said second region are serially arranged on said substrate along the light propagation direction.

5. An optical semiconductor apparatus according to any one of claims 1, 2 or 3, further comprising a wavelength selection means for selecting a radiation wavelength of said optical semiconductor apparatus.

6. An optical semiconductor apparatus according to claim 5, wherein said wavelength selection means comprises a diffraction grating formed along said first waveguide and said second waveguide.

7. An optical semiconductor apparatus according to claim 6, wherein said optical semiconductor apparatus is constructed as a distributed feedback laser.

8. An optical semiconductor apparatus according to claim 6, further comprising end facets and an antireflection coating provided on at least one of said end facets of said optical semiconductor apparatus.

9. An optical semiconductor apparatus according to claim 1, wherein said additional active layer comprises one of said first active layer and said second active layer.

10. An optical semiconductor apparatus according to claim 1, wherein said additional active layer is placed closer to a p-side than said common active layer.

11. An optical semiconductor apparatus according to any one of claims 1, 2 or 3, wherein said first active layer comprises a non-strained or compressively strained quantum well layer and said second active layer comprises a tensile-strained quantum well layer.

12. An optical semiconductor apparatus according to claim 11, wherein at least one of said non-strained or compressively-strained quantum well layer and said tensile-strained quantum well layer comprises a plurality of kinds of quantum well layers.

13. An optical semiconductor apparatus according to claim 11, wherein said first active layer and said second active layer respectively have substantially the same transition energy between a ground level of electrons in a conduction band of said quantum well layer and a ground level of holes in a valence band of said quantum well layer.

14. An optical semiconductor apparatus according to claim 2, wherein said second active layers respectively contained in said first active region and said second active region are identical with each other in construction.

15. An optical semiconductor apparatus according to claim 2, wherein said first active layer is placed closer to a p-side than said second active layer.

16. An optical semiconductor apparatus according to claim 13, wherein said first active layers respectively contained in said first active region and said second active region are identical with each other in construction.

17. An optical semiconductor apparatus according to claim 13, wherein said second active layer is placed closer to a p-side than said first active layer.

18. An optical semiconductor apparatus according to any one of claims 1, 2 or 3, further comprising an etching stopper layer for stopping an etching process performed during fabrication of said optical semiconductor apparatus.

19. An optical semiconductor apparatus according to claim 18, wherein said etching stopper layer is formed in one of said first active region and said second active region.

20. An optical semiconductor apparatus according to claim 18, wherein said etching stopper layer is formed immediately under said first active region and said second active region.

21. An optical semiconductor apparatus according to claim 18, wherein said substrate, said first region and said second region are formed with materials of $In_xGa_{1-x}As_yP_{1-y}$ series, and said etching stopper layer is made of InP.

22. An optical semiconductor apparatus according to any one of claims 1, 2 or 3, further comprising a boundary surface improving layer for improving a boundary condition between said first active layer and said second active layer.

23. An optical semiconductor apparatus according to claim 22, wherein said substrate, said first region and said second region are formed with materials of $In_xGa_{1-x}As_yP_{1-y}$ series, and said boundary surface improving layer is made of InP.

24. An optical semiconductor apparatus according to any one of claims 1, 2 or 3, wherein at least one of said first active layer and said second active layer is doped with an impurity.

25. An optical semiconductor apparatus according to any one of claims 1, 2 or 3, further comprising a barrier layer formed between said first active layer and said second active layer for separating said first active layer and said second active layer from each other.

26. An optical semiconductor apparatus according to any one of claims 1, 2 or 3, wherein said optical semiconductor apparatus is constructed as an oscillation polarization-mode switchable laser.

27. An optical semiconductor apparatus according to any one of claims 1, 2 or 3, wherein said optical semiconductor apparatus is constructed as a polarization-mode insensitive semiconductor optical amplifier.

28. A method for driving an optical semiconductor apparatus which includes a substrate; a first region formed on the substrate, the first region including a first waveguide which extends in a light propagation direction and is constructed so as to permit light waves in two different polarization modes to be propagated in the light propagation direction, the first waveguide containing a first active region which is constructed such that a gain for one of the two different polarization modes is dominant; a second region formed on the substrate, the second region including a second waveguide which extends in the light propagation direction, is coupled to said first waveguide and is constructed so as to permit light waves in the two different polarization modes to be propagated in the light propagation direction, the second waveguide containing a second active region which is constructed such that a gain for the other of the two different polarization modes is dominant, at least one of the first active region and the second active region including a first active layer, in which a gain for one of the two different polarization modes is dominant, and a second active layer, in which a gain for the other of the two different polarization modes is dominant; and stimulating means for stimulating the first active region and the second active region independently from each other, wherein both of the first active region and the second active region respectively include common active layers whose constructions are identical with each other and which are respectively comprised of at least one of the first active layer and the second active layer, and wherein one of the first active region and the second active region only includes the common active layer and the other of the first active region and said second active region includes the common active layer and an additional active layer, said driving method comprising the steps of:

establishing a bias state, in which a round-trip gain for one of the two different polarization modes competes with a round-trip gain for the other of the two different polarization modes, by controlling amounts of currents respectively injected into the first active region and the second active region by the stimulating means;

establishing a modulation bias point, in which light in one of the two different polarization modes is oscillated, by slightly increasing the amount of the current injected into one of the first active region and the second active region; and switching the polarization mode of the oscillated light between the two different polarization modes by injecting a signal of a minute modulation current into at least one of the first active region and the second active region.

29. An optical communication method for transmitting a signal from a transmitter to a receiver through an optical transmission line, the transmitter including an optical semiconductor apparatus which includes a substrate; a first region formed on the substrate, the first region including a first waveguide which extends in a light propagation direction and is constructed so as to permit light waves in two different polarization modes to be propagated in the light propagation direction, the first waveguide containing a first active region which is constructed such that a gain for one of the two different polarization modes is dominant; a second region formed on the substrate, the second region including a second waveguide which extends in the light propagation direction, is coupled to said first waveguide and is constructed so as to permit light waves in the two different polarization modes to be propagated in the light propagation direction, the second waveguide containing a second active region which is constructed such that a gain for the other of the two different polarization modes is dominant, at least one of the first active region and the second active region including a first active layer, in which a gain for one of the two different polarization modes is dominant, and a second active layer, in which a gain for the other of the two different polarization modes is dominant; and stimulating means for stimulating the first active region and the second active region independently from each other, wherein both of the first active region and the second active region respectively include common active layers whose constructions are identical with each other and which are respectively comprised of at least one of the first active layer and the second active layer, and wherein one of the first active region and the second active region only includes the common active layer and the other of the first active region and said second active region includes the common active layer and an additional active layer, said method comprising the steps of:

modulating the polarization mode of light output from the optical semiconductor apparatus between two different polarization modes by controlling current injected into the optical semiconductor apparatus;

selecting only the light output in one of the two different polarization modes to create an amplitude-modulated signal; and transmitting the amplitude-modulated signal through the optical transmission line.

30. An optical communication system for transmitting a signal from a transmitter to a receiver through an optical transmission line, said system comprising:

an optical semiconductor apparatus comprising: a substrate; a first region formed on said substrate, said first region including a first waveguide which extends in a light propagation direction, said first region being constructed so as to permit light waves in two different polarization modes to be propagated in the light propagation direction, said first waveguide containing a first active region which is constructed such that a gain for one of the two different polarization modes is dominant therein; a second region formed on said substrate, said second region including a second waveguide which extends in the light propagation direction, said second region being coupled to said first waveguide and being constructed so as to permit light waves in the two different polarization modes to be propagated in the light propagation direction, said second waveguide containing a second active region which is constructed such that a gain for the other of the two different polarization modes is dominant therein, at least one of said first active region and said second active region including a first active layer, in which a gain for one of the two different polarization modes is dominant, and a second active layer, in which a gain for the other of the two different polarization modes is dominant; and stimulating means for stimulating said first active region and said second active region independently from each other, wherein both of said first active region and said second active region respectively include common active layers whose constructions are identical with each other and which are respectively comprised of at least one of said first active layer and said second active layer, and wherein one of said first active region and said second active region only includes said common active layer and the other of said first active region and said second active region includes said common active layer and an additional active layer; and means for selecting only the light output in one of the two different polarization modes so as to create an amplitude-modulated signal, the amplitude-modulated signal being the signal transmitted from the transmitter to the receiver through the optical transmission line.

31. A light source apparatus comprising:

an optical semiconductor apparatus comprising: a substrate; a first region formed on said substrate, said first region including a first waveguide which extends in a light propagation direction, said first region being constructed so as to permit light waves in two different polarization modes to be propagated in the light propagation direction, said first waveguide containing a first active region which is constructed such that a gain for one of the two different polarization modes is dominant therein; a second region formed on said substrate, said second region including a second waveguide which extends in the light propagation direction, said second region being coupled to said first waveguide and being constructed so as to permit light waves in the two different polarization modes to be propagated in the light propagation direction, said second waveguide containing a second active region which is constructed such that a gain for the other of the two different polarization modes is dominant therein, at least one of said first active region and said second active region including a first active layer, in which a gain for one of the two different polarization modes is dominant, and a second active layer, in which a gain for the other of the two different polarization modes is dominant; and stimulating means for stimulating said first active region and said second active region independently from each other, wherein both of said first active region and said second active region respectively include common active layers whose constructions are identical with each other and which are respectively comprised of at least one of said first active layer and said second active layer, and wherein one of said first active region and said second active region only includes said common active layer and the other of said first active region and said second active region includes said common active layer and an additional active layer; and means for selecting only the light output in one of the two different polarization modes.

32. A method for driving an optical semiconductor apparatus which includes a substrate; a first region formed on the substrate, the first region including a first waveguide which extends in a light propagation direction and is constructed so as to permit light waves in two different polarization modes to be propagated in the light propagation direction, the first waveguide containing a first active region which is constructed such that a gain for one of the two different polarization modes is dominant; a second region formed on the substrate, the second region including a second waveguide which extends in the light propagation direction, is coupled to said first waveguide and is constructed so as to permit light waves in the two different polarization modes to be propagated in the light propagation direction, the second waveguide containing a second active region which is constructed such that a gain for the other of the two different polarization modes is dominant, at least one of the first active region and the second active region including a first active layer, in which a gain for one of the two different polarization modes is dominant, and a second active layer, in which a gain for the other of the two different polarization modes is dominant; and stimulating means for stimulating the first active region and the second active region independently from each other, wherein one of the first active region and the second active region includes the first active layer and the second active layer formed on the first active layer and the other of the first active region and the second active region includes only the second active layer, said driving method comprising the steps of:

establishing a bias state, in which a round-trip gain for one of the two different polarization modes competes with a round-trip gain for the other of the two different polarization modes, by controlling amounts of currents respectively injected into the first active region and the second active region by the stimulating means;

establishing a modulation bias point, in which light in one of the two different polarization modes is oscillated, by slightly increasing the amount of the current injected into one of the first active region and the second active region; and switching the polarization mode of the oscillated light between the two different polarization modes by injecting a signal of a minute modulation current into at least one of the first active region and the second active region.

33. An optical communication method for transmitting a signal from a transmitter to a receiver through an optical transmission line, the transmitter including an optical semiconductor apparatus which includes a substrate; a first region formed on the substrate, the first region including a first waveguide which extends in a light propagation direction and is constructed so as to permit light waves in two different polarization modes to be propagated in the light propagation direction, the first waveguide containing a first active region which is constructed such that a gain for one of the two different polarization modes is dominant; a second region formed on the substrate, the second region including a second waveguide which extends in the light propagation direction, is coupled to said first waveguide and is constructed so as to permit light waves in the two different polarization modes to be propagated in the light propagation direction, the second waveguide containing a second active region which is constructed such that a gain for the other of the two different polarization modes is dominant, at least one of the first active region and the second active region including a first active layer, in which a gain for one of the two different polarization modes is dominant, and a second active layer, in which a gain for the other of the two different polarization modes is dominant; and stimulating means for stimulating the first active region and the second active region independently from each other, wherein one of the first active region and the second active region includes the first active layer and the second active layer formed on the first active layer and the other of the first active region and the second active region includes only the second active layer, said method comprising the steps of:

modulating the polarization mode of light output from the optical semiconductor apparatus between two different polarization modes by controlling current injected into the optical semiconductor apparatus;

selecting only the light output in one of the two different polarization modes to create an amplitude-modulated signal; and transmitting the amplitude-modulated signal through the optical transmission line.

34. An optical communication system for transmitting a signal from a transmitter to a receiver through an optical transmission line, said system comprising:

an optical semiconductor apparatus comprising: a substrate; a first region formed on said substrate, said first region including a first waveguide which extends in a light propagation direction, said first region being constructed so as to permit light waves in two different polarization modes to be propagated in the light propagation direction, said first waveguide containing a first active region which is constructed such that a gain for one of the two different polarization modes is dominant therein; a second region formed on said substrate, said second region including a second waveguide which extends in the light propagation direction, said second region being coupled to said first waveguide and being constructed so as to permit light waves in the two different polarization modes to be propagated in the light propagation direction, said second waveguide containing a second active region which is constructed such that a gain for the other of the two different polarization modes is dominant therein, at least one of said first active region and said second active region including a first active layer, in which a gain for one of the two different polarization modes is dominant, and a second active layer, in which a gain for the other of the two different polarization modes is dominant; and stimulating means for stimulating said first active region and said second active region independently from each other, wherein one of said first active region and said second active region includes said first active layer and said second active layer formed on said first active layer and the other of said first active region and said second active region includes only said second active layer; and means for selecting only the light output in one of the two different polarization modes so as to create an amplitude-modulated signal, the amplitude-modulated signal being the signal transmitted from the transmitter to the receiver through the optical transmission line.

35. A light source apparatus comprising:

an optical semiconductor apparatus comprising: a substrate; a first region formed on said substrate, said first region including a first waveguide which extends in a light propagation direction, said first region being constructed so as to permit light waves in two different polarization modes to be propagated in the light propagation direction, said first waveguide containing a first active region which is constructed such that a gain for one of the two different polarization modes is dominant therein; a second region formed on said substrate, said second region including a second waveguide which extends in the light propagation direction, said second region being coupled to said first waveguide and being constructed so as to permit light waves in the two different polarization modes to be propagated in the light propagation direction, said second waveguide containing a second active region which is constructed such that a gain for the other of the two different polarization modes is dominant therein, at least one of said first active region and said second active region including a first active layer, in which a gain for one of the two different polarization modes is dominant, and a second active layer, in which a gain for the other of the two different polarization modes is dominant; and stimulating means for stimulating said first active region and said second active region independently from each other, wherein one of said first active region and said second active region includes said first active layer and said second active layer formed on said first active layer and the other of said first active region and said second active region includes only said second active layer; and means for selecting only the light output in one of the two different polarization modes.

* * * * *

UNITED STATES PATENT AND TRADEMARK OFFICE
CERTIFICATE OF CORRECTION

PATENT NO. : 5,946,336
DATED : August 31, 1999
INVENTOR(S) : Natsuhiko Mizutani et al.

It is certified that error appears in the above-identified patent and that said Letters Patent is hereby corrected as shown below:

ON TITLE PAGE AT [56] REFERENCES CITED,
FOREIGN PATENT DOCUMENTS

"2117190" should read --2-117190--;
"7162088 11/1993" should read --7-162088 6/1995--.

Column 1
Line 26, "Laid-Open No. 5-310592 (1993)" should read --Application No. 5-310592 (1993), laid open as Japanese Patent Laid-Open No. 7-162088 (1995)--.

Column 2
Line 26, "lasers," should read --laser,--.

Column 19
Line 15, ". . ." should read --. . .,--.

Column 22,
Line 13, "claim 13," should read --claim 3,--;
Line 17, "claim 13," should read --claim 3,--.

Signed and Sealed this

Third Day of July, 2001

*Attest:*

*Nicholas P. Godici*

*Attesting Officer*

NICHOLAS P. GODICI
*Acting Director of the United States Patent and Trademark Office*